(12) United States Patent
Lemke et al.

(10) Patent No.: US 9,107,335 B2
(45) Date of Patent: Aug. 11, 2015

(54) METHOD FOR MANUFACTURING AN INTEGRATED CIRCUIT AND AN INTEGRATED CIRCUIT

(71) Applicant: Infineon Technologies AG, Neubiberg (DE)

(72) Inventors: Marko Lemke, Dresden (DE); Mirko Vogt, Dresden (DE); Stefan Tegen, Dresden (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 268 days.

(21) Appl. No.: 13/769,886

(22) Filed: Feb. 19, 2013

(65) Prior Publication Data
US 2014/0233200 A1  Aug. 21, 2014

(51) Int. Cl.
| | |
|---|---|
| H05K 1/16 | (2006.01) |
| H05K 1/18 | (2006.01) |
| H01M 4/82 | (2006.01) |
| H05K 13/00 | (2006.01) |
| H05K 1/02 | (2006.01) |
| H01G 9/15 | (2006.01) |
| H01L 23/58 | (2006.01) |
| H01L 27/01 | (2006.01) |
| H01G 11/84 | (2013.01) |

(52) U.S. Cl.
CPC .............. *H05K 13/00* (2013.01); *H01G 9/15* (2013.01); *H01L 23/58* (2013.01); *H05K 1/0296* (2013.01); *H01G 11/84* (2013.01); *H01L 27/016* (2013.01); *H05K 1/16* (2013.01); *H05K 2201/10037* (2013.01); *Y02E 60/122* (2013.01); *Y10T 29/49108* (2015.01)

(58) Field of Classification Search
CPC .......................... H05K 13/00; H05K 1/0296
USPC .......... 174/260, 261; 361/760, 764, 500, 504, 361/523–525; 29/623.1–623.5, 25.03
See application file for complete search history.

(56) References Cited

U.S. PATENT DOCUMENTS

| | | | |
|---|---|---|---|
| 2003/0185357 A1* | 10/2003 | Kaghazian ................ | 379/93.24 |
| 2008/0032236 A1* | 2/2008 | Wallace et al. ............ | 430/319 |
| 2008/0068780 A1* | 3/2008 | Shioga et al. ............. | 361/524 |
| 2008/0203972 A1* | 8/2008 | Sather et al. .............. | 320/137 |
| 2011/0048781 A1* | 3/2011 | Neudecker et al. ........ | 174/260 |
| 2011/0095720 A1* | 4/2011 | Shacklette et al. ......... | 320/101 |

(Continued)

FOREIGN PATENT DOCUMENTS

WO    2010043991 A1    4/2010

OTHER PUBLICATIONS

Seok Woo Lee et al. "Anomalous Shape Changes of Silicon Nanopillars by Electrochemical Lithiation", Nano Letters, ACS Publications, XXXX American Chemical Society, May 26, 2011, pp. 1-6.

(Continued)

*Primary Examiner* — Hoa C Nguyen

(57) ABSTRACT

A method for manufacturing an integrated circuit may include forming an electronic circuit in or above a carrier; forming at least one metallization layer structure configured to electrically connect the electronic circuit; and forming a solid state electrolyte battery at least partially in the at least one metallization layer structure, wherein the solid state electrolyte battery is electrically connected to the electronic circuit.

19 Claims, 12 Drawing Sheets

(56) References Cited

U.S. PATENT DOCUMENTS

2011/0223467 A1* 9/2011 Shacklette et al. ............ 429/160
2013/0128488 A1* 5/2013 Forster et al. ................. 361/820

OTHER PUBLICATIONS

Si-Young Park et al. "Fabrication of nanowires with high aspect ratios utilized by dry etching with SF6: C4F8 and self-limiting thermal oxidation on Si substrate", J. Vac. Sci. Technol.B 28(4), Jul./Aug. 2010, American Vacuum Society, pp. 763-768.

Bruce Dunn et al. "Three-Dimensional Microbatteries for Mems/Nems Technology", UCLA, 2010 IEEE, pp. 164-167.

Peter H.L. Notten et al. "3-D Integrated All-Solid-State Rechargeable Batteries", 2007, Wiley-VCH Verlag GmbH & Co. KGaA, Weinheim, Adv. Mater. 2007, 19, pp. 4564-4567.

Kevin S. Jones "State of Solid-State Batteries", Software and Analysis of Advanced Materials Processing Center, Univerity of Florida, pp. 1-60.

Ksenia Anokhina "Investigation of Metal-assisted Si Etching for Fabrication of Nanoimprint Lithography Stamps", Technical Report, IDE 1056, Oct. 2010, pp. 1-42.

* cited by examiner

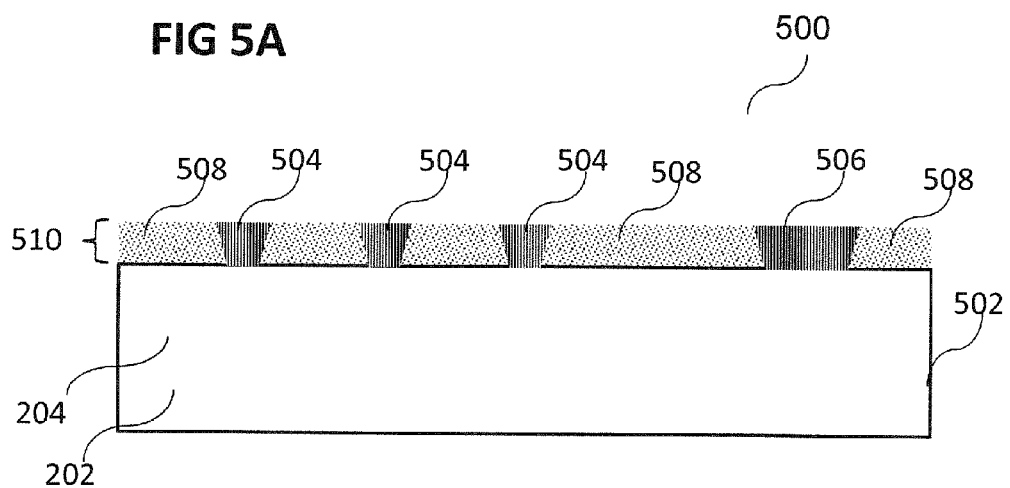

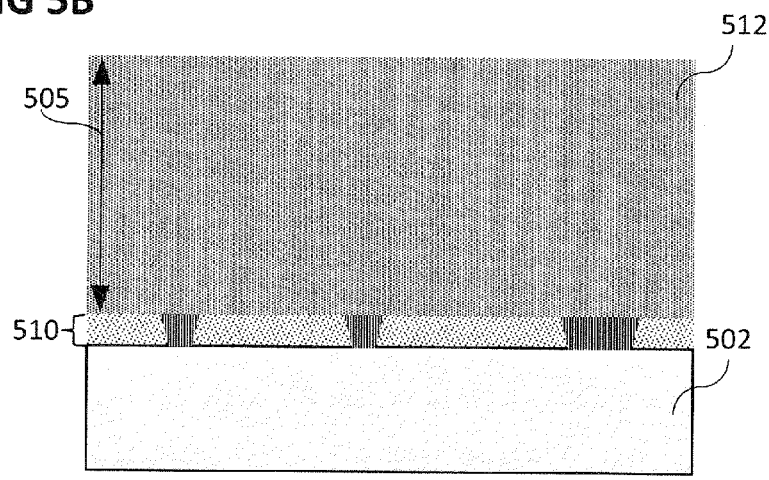
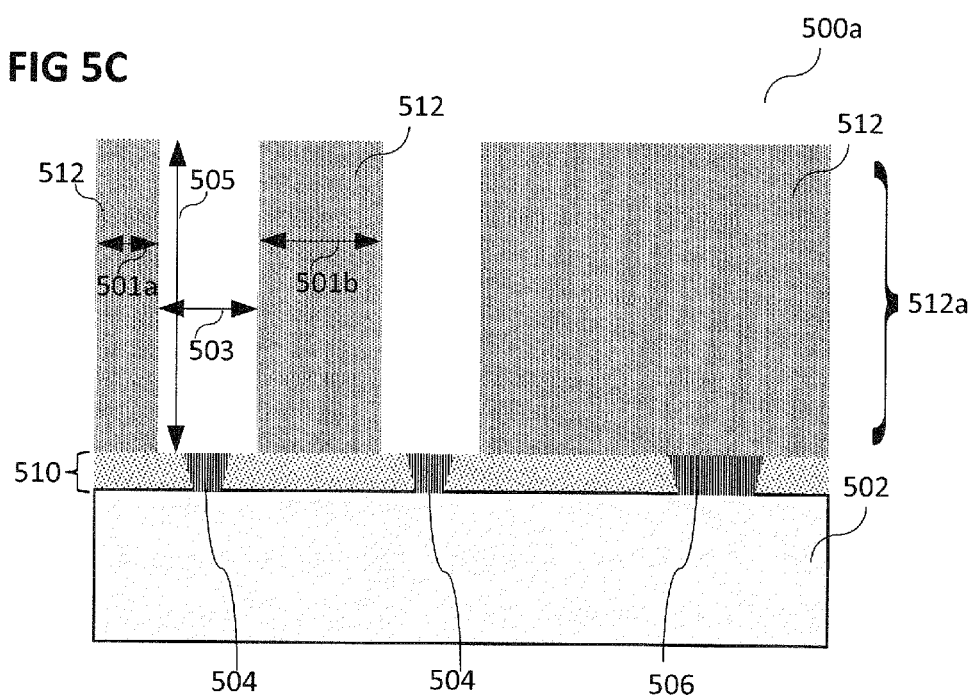

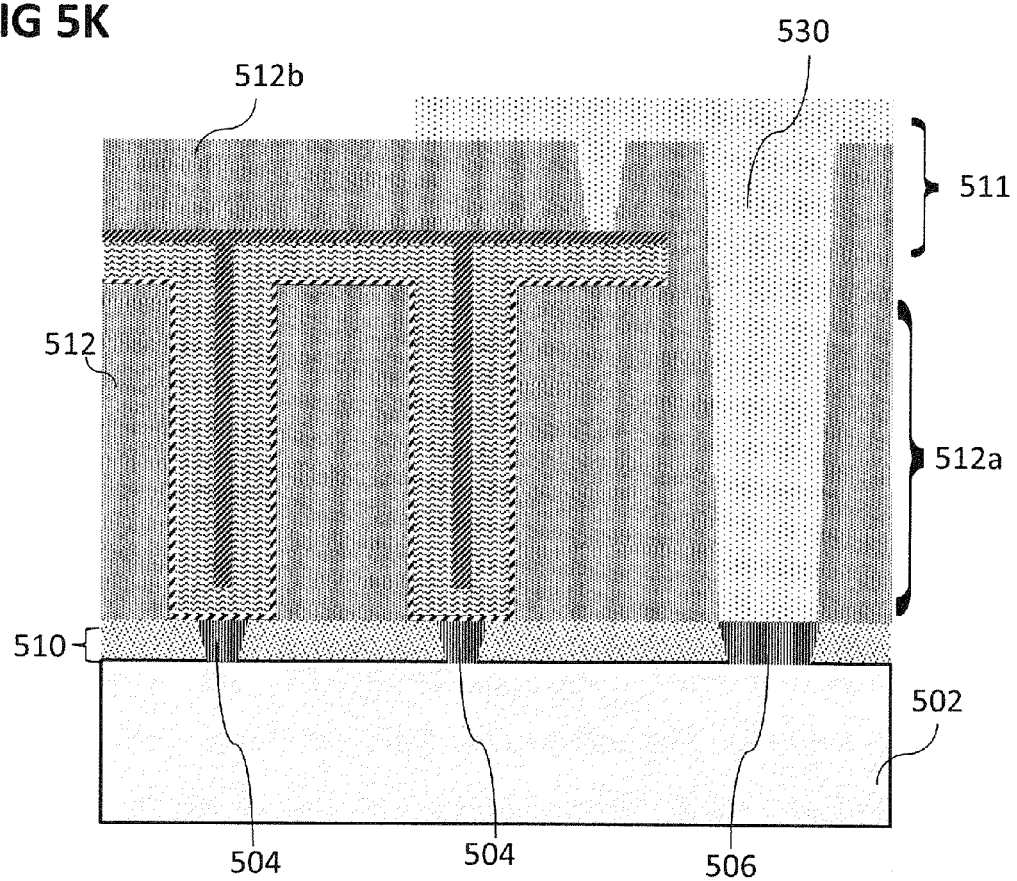

METHOD FOR MANUFACTURING AN INTEGRATED CIRCUIT AND AN INTEGRATED CIRCUIT

TECHNICAL FIELD

Various embodiments relate generally to a method for manufacturing an integrated circuit and to an integrated circuit.

BACKGROUND

In semiconductor industry a variety of processes are utilized for manufacturing electronic devices, such as processors, memory chips, and sensors, for example. Besides this, it may be desirable to develop fabrication processes for batteries, e.g. thin-film batteries, using similar fabrication techniques as they are used in semiconductor industry. Current thin-film deposition techniques may allow fabrication of a lithium-ion based battery, or a rechargeable lithium-ion based battery in thin-film technology.

SUMMARY

A method for manufacturing an integrated circuit in accordance with one or more embodiments may include: forming an electronic circuit in or above a carrier; forming at least one metallization layer structure configured to electrically connect the electronic circuit; and forming a solid state electrolyte battery at least partially in the at least one metallization layer structure, wherein the solid state electrolyte battery is electrically connected to the electronic circuit.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 5A to 5K respectively show a cross section of an integrated circuit during manufacture, according to various embodiments;

FIG. 5K shows an integrated circuit including an electronic circuit and a battery, according to various embodiments.

DESCRIPTION

Figure 1:
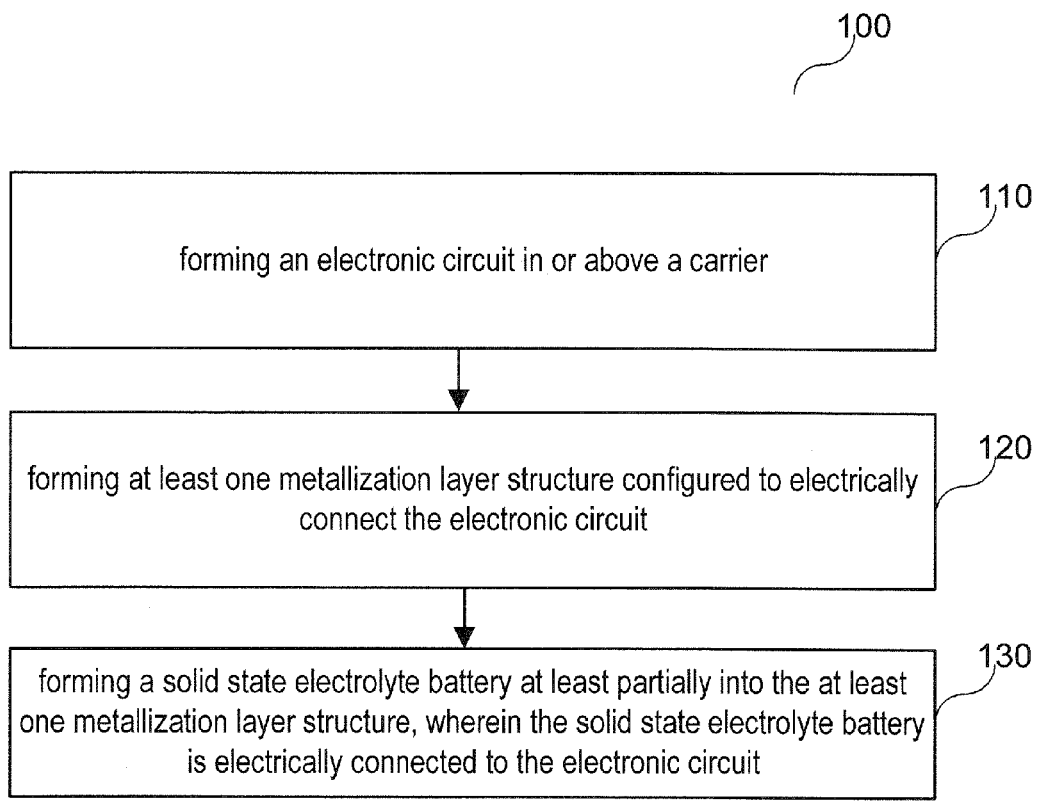
FIG. 1 shows a method for manufacturing an integrated circuit in a flow diagram, according to various embodiments.

The following detailed description refers to the accompanying drawings that show, by way of illustration, specific details and embodiments in which the invention may be practiced.

The word "over" used with regards to a deposited material formed "over" a side or surface or deposit a layer "over" a carrier, may be used herein to mean that the deposited material may be formed "directly on", e.g. in direct contact with, the implied side, surface, or carrier. The word "over" used with regards to a deposited material formed "over" a side or surface or to deposit a layer "over" a carrier, may be used herein to mean that the deposited material may be formed "indirectly on" the implied side, surface, or carrier with one or more additional layers being arranged between the implied side, surface, or carrier and the deposited material.

The term "lateral" used with regards to the lateral extension of a structure (or the lateral extension of a structure element), may be used herein to mean an extension along a direction parallel to the surface of a carrier. That means that the surface of a carrier (e.g. the surface of a substrate, or the surface of a wafer) may serve as reference. Further, the term "width" used with regards to a width of a structure (or a width of a structure element) may be used herein to mean the lateral extension of a structure (or a lateral extension of a structure element). Further, the term "height" used with regards to a height of a structure (or a height of a structure element), may be used herein to mean an extension of a structure (or a structure element) along a direction perpendicular to the surface of a carrier (the surface of a carrier may be the main processing surface of the carrier).

The word "cover" used with regards to deposited material covering a structure (or a structure element), may be used herein to mean that a deposited material may cover a structure (or a structure element) completely, e.g. covering all exposed sides and surfaces of a structure (or a structure element). The word "cover" used with regards to deposited material covering a structure (or a structure element), may be used herein to mean that the deposited material may cover a structure (or a structure element) at least partially, e.g. at least partially covering the exposed sides and surfaces of a structure (or a structure element).

According to various embodiments, forming a layer (e.g. depositing a layer, e.g. depositing a material, e.g. using a layering process) as described herein may also include forming a layer, wherein the layer may include various sub-layers, whereby different sub-layers may include different materials respectively. In other words, various different sub-layers may be included in a layer, or various different regions may be included in a deposited layer or in a deposited material.

Since there may be many individual processes used in semiconductor processing (e.g. in the fabrication of an integrated circuit, a chip, or a battery, e.g. in processing a carrier, a substrate, or a wafer including a battery), usually carried out in sequence, several basic manufacturing techniques may be used at least once in the overall manufacturing process. The following description of basic techniques should be understood as illustrating examples, which techniques may be included in processes described in the following. The basic techniques exemplarily described herein may be not necessarily need to be construed as preferred or advantageous over other techniques or methods, since they only serve to illustrate how one or more embodiments of the invention may be practiced. For sake of brevity the illustration of basic techniques exemplarily described herein is only a short overview and should not be considered as exhaustive specification.

According to various embodiments, at least one of the following basic techniques may be included in a method for manufacturing an integrated circuit, or e.g. in a method for manufacturing an integrated circuit including a battery.

According to various embodiments, at least one layering or at least one layering process may be used in a method for manufacturing an integrated circuit, as described herein. In a layering process, a layer (also generally referred to as film or thin film) may be deposited over a surface (e.g. over a carrier, over a wafer, over a substrate, over another layer, over a plurality of structure elements, or the like) using deposition techniques which may include chemical vapor deposition (CVD, or a CVD process) and physical vapor deposition (PVD, or a PVD process), according to various embodiments. According to various embodiments, the thickness of a deposited layer may be in the range of a few nanometers up to several micrometers depending on its specific function. According to various embodiments, thin layers in the range of a few nanometers, e.g. having a layer thickness smaller than 50 nm, may be formed using an atomic layer deposition. Further, according to various embodiments, a layer may include at least one of an electrically insulating material, an electrically semiconducting material, and an electrically conductive material, depending on the respective specific function of the layer. According to various embodiments, electrically conductive materials, as for example aluminium, aluminium-silicon alloys, aluminium-copper alloys, nichrome (an alloy of nickel, chromium, and/or iron), tungsten, titanium, molybdenum, or gold (or the like), may be deposited using CVD or PVD. According to various embodiments, semiconducting materials, as for example silicon (e.g. epitaxially grown silicon, polycrystalline silicon (also referred to as polysilicon), or amorphous silicon), germanium, a semiconductor compound material such as gallium arsenide (GaAs), indium phosphide (InP), or indium gallium arsenide (InGaAs) may be deposited using CVD. Insulating materials, as for example silicon oxide, silicon nitride, metal oxides (e.g. alumina), organic compounds, polymers, (or the like) may be deposited using CVD or PVD. According to various embodiments, modifications of these processes may be used as described in the following.

According to various embodiments, a chemical vapor deposition process (CVD process) may include a variety of modifications, as for example atmospheric pressure CVD (APCVD), low pressure CVD (LPCVD), ultrahigh vacuum CVD (UHVCVD), plasma enhanced CVD (PECVD), high density plasma CVD (HDPCVD), remote plasma enhanced CVD (RPECVD), atomic layer CVD (ALCVD), vapor phase epitaxy (VPE), metal organic CVD (MOCVD), hybrid physical CVD (HPCVD), and the like. According to various embodiments, silicon, polysilicon, amorphous silicon, silicon dioxide, silicon nitride, and the like may be deposited using LPCVD or ALCVD, but also platinum, titanium nitride, and LiCoO, may be deposited using LPCVD or ALCVD.

According to various embodiments, physical vapor deposition may include a variety of modifications, as for example magnetron sputtering, ion-beam sputtering (IBS), reactive sputtering, high-power impulse magnetron sputtering (HIPIMS), vacuum evaporation, molecular beam epitaxy (MBE), and the like.

According to various embodiments, a layering process may also include thermal oxidation (also referred to as thermal oxidation process). According to various embodiments, thermal oxidation may be used to grow high quality silicon oxide layers (so-called high temperature oxide layer (HTO)) on a silicon surface, e.g. at a temperatures in the range from about 800° C. to about 1200° C. The thermal oxidation may be performed at atmospheric pressure or at high pressure and as further modification as a rapid thermal oxidation process (RTO). According to various embodiments, also thermal nitridation may be applied to generate high quality nitride or oxynitride layers (e.g. silicon nitride layers or silicon oxynitride layers), e.g. using rapid thermal nitridation (e.g. at temperatures up to about 1300° C.).

Further, according to various embodiments, a process which may be applied to generate a metal layer may be plating, e.g. electroplating or electroless plating. According to various embodiments, plating may be used while forming a metallization layer structure.

It should be noted, that a variety of combinations of the materials and processes may be used within a layering process, according to various embodiments. Depending on specific aspects, as for example crystalline quality, surface roughness, edge covering behavior, growth speed, and yield, the most suitable process may be applied for the respective material, according to various embodiments.

According to various embodiments, some processes during manufacture of an integrated circuit may require a conformally deposited layer or a conformally depositing a layer (e.g. for forming a battery layer stack over a patterned base layer or over a base structure), which means that a layer (or a material forming a layer) may exhibit only small thickness variations along an interface with another body, e.g. a layer may exhibit only small thickness variations along edges, steps or other elements of the morphology of the interface. According to various embodiments, layering processes such as plating, atomic layer deposition (ALD), or several CVD processes (e.g. ALCVD, or LPCVD) may be suitable to generate a conformal layer or a conformally deposited layer of a material.

According to various embodiments, at least one patterning or at least one patterning process may be used in a method for manufacturing an integrated circuit, as described herein. According to various embodiments, a patterning process may include removing selected portions of a surface layer or of a material. After a surface layer may be partially removed, a pattern (or a patterned layer or patterned surface layer or a plurality of structure elements) may remain at least one of over and in the underlying structure (e.g. a patterned base layer may remain on an underlying structure). Since a plurality of processes may be involved, according to various embodiments, there are various possibilities to perform a patterning process, wherein aspects may be: selecting at least one portion of a surface layer (or a material) which shall be removed, e.g. using at least one lithographic process; and removing the selected portions of a surface layer, e.g. using at least one etch process.

According to various embodiments, a variety of lithographic processes may be applied generating a lithographic mask (a so-called photomask), as for example photolithography, microlithography or nanolithography, electron beam lithography, X-ray lithography, extreme ultraviolet lithography (EUV or EUVL), interference lithography, and the like. According to various embodiments, a lithographic process may include at least one of an initial cleaning process, a preparation process, applying a resist (e.g. a photoresist), exposing the resist (e.g. exposing the photoresist to a pattern of light), developing the resist (e.g. developing the photoresist using a chemical photoresist developer).

According to various embodiments, an initial cleaning process or a cleaning process, which may be included in a lithographic process (or which may be included in a general process in semiconductor processing), may be applied to remove organic or inorganic contaminations (or material) from a surface (e.g. from a surface layer, from a carrier, from a wafer, and the like) by for example wet chemical treatment. According to various embodiments, the initial cleaning process or a cleaning process may include at least one of the following processes: RCA (Radio Corporation of America) cleaning (also known as Organic Clean (SC1) and Ionic Clean (SC2)); SCROD (single-wafer spin cleaning with repetitive use of ozonized water and diluted HF); IMEC wafer cleaning; post chemical mechanical polishing (post-CMP) cleaning process; cleaning via de-ionized water (DIW), piranha etch and/ or a metal etch; (and the like). According to various embodiments, a cleaning process may also be applied for removing a thin oxide layer (e.g. a thin silicon oxide layer) from a surface (e.g. from a surface layer, from a carrier, or from a wafer, and the like).

According to various embodiments, a preparation process, which may be included in a lithographic process, may be applied to promote the adhesion of the photoresist to a surface (e.g. to a surface layer, to a carrier, or to a wafer, and the like). According to various embodiments, the preparation process may include applying a liquid or gaseous adhesion promoter (e.g. bis(trimethylsilyl)amine (HMDS)).

According to various embodiments, a resist, which may be included in a lithographic process, may be applied to cover a surface (e.g. a surface layer, a carrier, or a wafer, and the like) homogeneously. According to various embodiments, applying a resist may include spin coating to generate a thin homogenous layer of the resist. Afterwards, a resist may be prebaked to drive off excess resist solvent, according to various embodiments. According to various embodiments, several types of resists (e.g. a photoresist) may be used adapted to the process of exposing the resist to achieve desired results. According to various embodiments, positive photoresists (e.g. DNQ-Novolac, PMMA, PMIPK, PBS, and the like) may be used, and/or negative photoresists (e.g. SU-8, poly isoprene, COP, and the like) may be used.

According to various embodiments, a lithographic process may include exposing a resist so that a desired pattern may be transferred to the resist, e.g. by using light or electrons, wherein the desired pattern may be defined by a patterned mask (e.g. a glass carrier with a patterned chromium layer). According to various embodiments, mask-less lithography may be applied, wherein a precise beam (e.g. an electron beam or a laser beam) may be projected without using a mask directly onto the surface including the resist. The wavelength of the used light may range from the wavelength of the visible light to a smaller wavelength in the ultra violet range, according to various embodiments. According to various embodiments, the exposure may be performed using X-rays or electrons having even a shorter wavelength than ultra violet light. According to various embodiments, projection exposure systems (steppers or scanners) may be used projecting the mask many times onto a surface including a resist to create the complete exposure pattern.

According to various embodiments, a lithographic process may include developing a resist (e.g. developing a photoresist using a photoresist developer), to partially remove the resist generating a patterned resist layer remaining on the surface (e.g. on a surface layer or on a carrier, a wafer, and the like). According to various embodiments, developing a resist may include a post exposure bake (a heat treatment, e.g. rapid thermal processing) before the actual developing process may be performed. According to various embodiments, the developing process may include a chemical solution (a so-called developer) as for example sodium hydroxide or tetramethylammonium hydroxide (TMAH, a metal ion free developer). According to various embodiments, the remaining patterned resist may be solidified in a hard bake process (a heat treatment, e.g. rapid thermal processing), realizing a more durable protecting layer for later processes as for example ion implantation, wet chemical etching, or plasma etching (and the like).

Independently of the described lithographic processes, a resist may be removed completely at a desired processing stage (e.g. after at least one of an etch process, ion implantation process, and a deposition process have been performed) in a so-called resist strip process. According to various embodiments, a resist may be removed chemically and/or by using oxygen plasma.

It should be noted, that a lithographic process, according to various embodiments, including applying a resist, exposing a resist, and developing a resist may also be considered as a patterning process, wherein a patterned resist layer (a soft mask, or a resist mask) may be generated by the lithographic process. Subsequently, according to various embodiments, a pattern can be transferred from a patterned resist layer to a previously deposited or grown layer (or a carrier, and the like) using an etch process, wherein the previously deposited or grown layer may include a hard mask material as for example an oxide or a nitride (e.g. silicon oxide, e.g. silicon nitride) creating a so-called hard mask.

According to various embodiments, an etch process, which may be included in a patterning process, may be applied to remove material from a previously deposited layer, a grown surface layer, a carrier (or substrate, or wafer), and the like. According to various embodiments, an etch process may be performed depending on the specific requirements for this process. According to various embodiments, an etch process may be selective or non-selective with respect to a specific material. According to various embodiments, an etch process may be isotropic or anisotropic.

According to various embodiments, a dry etch process may be applied, as for example plasma etching, ion beam milling, or reactive ion etching (RIE).

According to various embodiments, a physical etch process may be applied (e.g. ion beam milling or sputter etching).

Further, according to various embodiments, to create at least one of a deep penetration, a steep-sided hole, and a trench in a material (e.g. in a wafer, in a substrate, in a deposited or grown layer, and the like) deep reactive-ion etching (DRIE) may be applied. According to various embodiments, a pulsed etching (time-multiplexed etching) may be applied.

Materials (e.g. single crystalline or polycrystalline or amorphous materials) may be etched using an anisotropic dry etch process to create a plurality of structure elements having a high aspect ratio (ratio of width to height of a structure element), e.g. having an aspect ratio of about 5 or even greater, e.g. of about 10 or even greater, e.g. of about 20 or even greater, e.g. in the range of about 5 to about 30, e.g. in the range of about 15 to about 25, e.g. having an aspect ratio of about 20. Referring to this, the width (or the lateral extension) of a structure element may be in the range of about 20 nm to about 400 nm, or larger than 400 nm, or e.g. in the range of about 40 nm to about 200 nm, e.g. in the range of about 50 nm to about 100 nm, or smaller than 50 nm, according to various embodiments.

According to various embodiments, a patterned layer may also serve as a mask (a so-called hard mask) for other processes like etching, ion implantation, and/or layering. Further, according to various embodiments, a patterned photoresist may also serve as a mask (a so-called soft mask). According to various embodiments, a soft mask may be used for a lift-of process. The mask material may usually be selected with regard to specific needs as for example chemical stability, e.g. to perform a selective etch process which does not affect the mask material (e.g. etching away the mask material completely), or mechanical stability, e.g. to protect regions from being penetrated by ions, or to define the shape of generated structure elements during a layering process, and the like.

According to various embodiments, at least one doping process may be used in a method for manufacturing an integrated circuit, as described herein. According to various embodiments, various techniques may be applied or may be adapted to perform a doping process, as for example thermal diffusion and/or ion implantation. Electron doped material may be called n-type (negative-type) and hole doped material may be called p-type (positive type). According to various embodiments, in metal-oxide-semiconductor technology (MOS-technology) a channel may include electrons (n-channel, or nMOS) or holes (p-channel or pMOS) and in analogy, a metal-oxide-semiconductor field-effect transistor (MOSFET) may include an n-channel (nMOSFET) or a p-channel (pMOSFET).

According to various embodiments, a heat treatment may be included in various processes (or at various process stages) during manufacture of an integrated circuit, as described herein, e.g. in combination with a patterning process, as for example after a doping process, after applying photoresist, and/or after depositing electrical contacts to alloy the electrically conductive material (e.g. a metal) with a carrier (or with the underlying structure), or to provide optimal deposition conditions for a layering process. According to various embodiments, the heating of a carrier (a wafer, a substrate, and the like) may be performed with direct contact, e.g. a hot plate, or by radiation, e.g. using a laser or lamps. According to various embodiments, a rapid thermal processing (RTP) may be applied, which may be performed under vacuum conditions using a laser heater or lamp heater, wherein a material (e.g. a wafer, a substrate, a carrier, and the like) may be heated up to several hundred degrees Celsius or up to about 1000° C. or even greater within a short time period, e.g. within several seconds (e.g. about 1 s to about 10 s). Subsets of rapid thermal processing are rapid thermal annealing (RTA) and rapid thermal oxidation (RTO).

According to various embodiments, at least one contact metallization process may be applied in a method for manufacturing an integrated circuit. A contact metallization may be in direct contact with at least one structure element of an electronic circuit (or with at least one structure on a carrier), wherein contact metallization process may realize required electrical connections (or interconnections) for the at least one structure element of an electronic circuit. According to various embodiments, a contact metallization process may include at least one layering process and at least one patterning process. According to various embodiments, a contact metallization process may include depositing a layer of a dielectric material (e.g. a low-k dielectric material, e.g. undoped silicate glass, and the like), forming contact holes at the desired locations (e.g. using at least one patterning process), and filling the contact holes with at least one electrically conductive material (e.g. with at least one of a metal (e.g. aluminium, copper, tungsten, titanium, molybdenum, gold, platinum, and the like), a metallic material (e.g. titanium nitride, platinum silicide, titanium silicide, tungsten silicide, molybdenum silicide, and the like), electrically conductive polysilicon, and a metal alloy (e.g. aluminium-silicon alloys, aluminium-copper alloys, aluminium-silicon-copper alloys, nichrome, titanium-tungsten alloys, and the like)) using a layering process. Further, according to various embodiments, a contact metallization process (or a metallization process) may include forming additional layers for example as a barrier (e.g. including at least one of molybdenum, a transition metal nitride (e.g. titanium nitride), platinum silicide, titanium silicide, tungsten silicide, molybdenum silicide, borides, and the like), or as adhesion promoter (e.g. including at least one of platinum silicide, titanium silicide, tungsten silicide, molybdenum silicide, and the like).

Further, according to various embodiments, a metallization process may be applied to generate a single level metallization having one metal layer or a multilevel metallization including a plurality of metal layers after the contact metallization may be provided. According to various embodiments, a metallization process may include at least one layering process and may include at least one patterning process. According to various embodiments, a metallization process or a contact metallization process may include a lift-off process, after having deposited the electrically conductive material over a soft mask, wherein the soft mask may be removed and thereby the electrically conductive material deposited over the soft mask may be removed as well.

According to various embodiments, applying a metallization process may further include a planarization of a carrier surface (wafer surface, substrate surface, and the like) and/or a planarization of intermediate layers included in a multilevel metallization process (e.g. using chemical mechanical polishing).

According to various embodiments, a planarization process may be applied as for example to reduce the surface roughness or the reduced variations in the depth profile of a carrier or a wafer surface including structure elements having different heights, since some processes may require a flat surface (a planar surface) (e.g. high resolution lithography). According to various embodiments, a planarization process may be necessary as the number of performed layering processes and patterning processes increases and as a planar surface may be required. According to various embodiments, a chemical mechanical polishing process (CMP or CMP process) may be performed, wherein this process may be selective to specific materials on the surface of a carrier (of a wafer, substrate, surface layer, and the like). According to various embodiments, a chemical mechanical polishing process (CMP) may be performed, wherein this process may be non-selective to specific materials on the surface of a carrier (of a wafer, substrate, surface layer, and the like). According to various embodiments, a planarization process may be included additionally in several processes, e.g. in layering processes, patterning processes, and the like.

According to various embodiments, a metallization layer structure may be formed by forming at least one of a contact metallization and a metallization.

According to various embodiments, an electronic circuit may be fabricated at least one of over and in a carrier. According to various embodiments, a carrier (e.g. a substrate, a wafer, and the like) may be made of semiconductor materials of various types, including silicon, germanium, Group III to V or other types, including polymers, for example, although in another embodiment, other suitable materials can also be used. In an embodiment, the wafer substrate may be made of silicon (doped or undoped), in an alternative embodiment, the wafer substrate may be a silicon on insulator (SOI) wafer. As an alternative, any other suitable semiconductor materials can be used for the wafer substrate, for example semiconductor compound material such as gallium arsenide (GaAs), indium phosphide (InP), but also any suitable ternary semiconductor compound material or quaternary semiconductor compound material such as indium gallium arsenide (InGaAs).

According to various embodiments, in general, the methods as described herein may be applied independently from the case, whether a structure (e.g. an electronic circuit or a battery) is formed over a certain underlying structure or material or in a certain underlying structure or material or, both, over and in a certain underlying structure or material.

The fabrication of an integrated battery may be challenging, if an electronic (or electrical) circuit and an integrated battery (e.g. a battery in thin-film technology) are intended to be fabricated in the very same manufacturing process as a structural entity, since for example high processing temperatures during commonly used layering processes during fabrication of the electronic circuit may damage the integrated battery. In the case that a rechargeable lithium-ion battery is integrated into an electronic circuit, the high mobility of the lithium-ions may cause several problems in the electronic circuit, e.g. due to diffusion of lithium into the electronic circuit, and the performance of a chip or the functionality of the electronic circuit may be affected. However, integrating a battery into an electronic circuit (or integrating a battery in a semiconductor device) may be beneficial for a variety of devices (or integrated circuits). In the following, a method for manufacturing an integrated circuit is described, according to various embodiments, wherein a battery (e.g. a battery in thin-film technology) is integrated into an electronic circuit by using typical processes of semiconductor industry (e.g. layering and patterning as described above). Therefore, an electronic circuit and a battery may be fabricated within one processing line.

Figure 2:
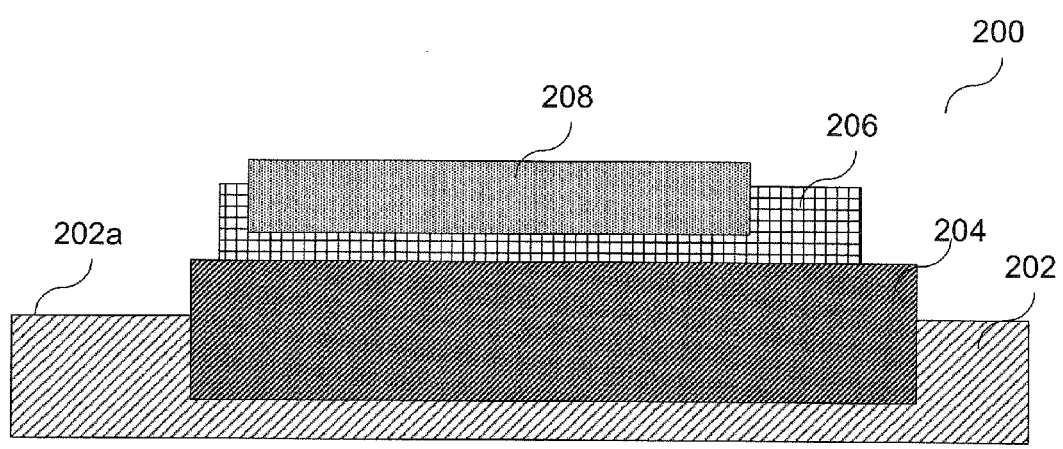
FIG. 2 shows a cross section of a carrier including a battery, manufactured according to the method shown in FIG. 1, according to various embodiments.

FIG. 1 shows a flow diagram of a method 100 for manufacturing an integrated circuit, according to various embodiments. According to various embodiments, the method 100 may include, in 110, forming an electronic circuit at least one of over and in a carrier (in or above a carrier); in 120, forming at least one metallization layer structure configured to electrically connect the electronic circuit; and, in 130, forming a solid state electrolyte battery at least partially in the at least one metallization layer structure, wherein the solid state electrolyte battery is electrically connected to the electronic circuit. Referring to FIG. 1, a cross section of an integrated circuit 200 is illustrated in FIG. 2, after processes 110, 120, and 130 have been carried out, according to various embodiments. Accordingly, the integrated circuit 200 may include at least the following: a carrier 202; an electronic circuit 204 formed at least one of over and in the carrier 202, a metallization layer structure 206 formed at least one of over and in the electronic circuit 204 configured to electrically connect the electronic circuit 204; and a solid state electrolyte battery 208 formed at least partially in the metallization layer structure 206, wherein the solid state electrolyte battery 208 is electrically connected to the electronic circuit 204, according to various embodiments. According to various embodiments, the illustrated arrangement of carrier 202, electronic circuit 204, metallization layer structure 206, and solid state electrolyte battery 208, as shown in FIG. 2, should be regarded as illustrative arrangement, wherein, according to various embodiments, other arrangements may be possible as well, having the same features as described referring to FIG. 2.

According to various embodiments, process 110 of forming an electronic circuit at least one of over and in a carrier 202 may include at least one of the following: a layering process, a patterning process, a doping process, a lithographic process, a heat treatment, a cleaning or polishing process, as described before. According to various embodiments, the carrier 202 may include the materials as described before. According to various embodiments, the carrier 202 may be a silicon wafer. According to various embodiments, a surface 202a may be a main processing surface of the carrier (or a main processing surface of the silicon wafer) 202.

Since the solid state electrolyte battery 208, according to various embodiments, may be formed at least partially in the at least one metallization layer structure 206, wherein the at least one metallization layer structure 206 may be formed (e.g. at least partially) over the electronic circuit 204, process 110 of forming an electronic circuit 204 at least one of over and in a carrier 202 may include a variety of processes which may be carried out independently or substantially independently from the processes performed after process 110 has been carried out. According to various embodiments, process 110 of method 100 may be performed independently or substantially independently from the subsequently performed processes 120 and 130 of method 100. In other words, process parameters used for performing process 110 may be selected with little attention to following processes to ensure optimal conditions for forming the electronic circuit 204. According to various embodiments, manufacturing electronic circuit 204, for example in MOS-technology (metal-oxide-semiconductor-technology), may require high process temperatures (e.g. during a layering process or e.g. during the growth of a high temperature oxide), e.g. more than 700° C., e.g. more than 1000° C., or even higher process temperatures, e.g. 1200° C., according to various embodiments.

According to various embodiments, process 110 may be applied for creating electronic circuit 204, wherein electronic circuit 204 may include at least one of the following basic semiconductor technologies: MOS-technology (metal oxide semiconductor technology), nMOS-technology (n-channel MOS-technology), pMOS-technology (p-channel MOS-technology), CMOS-technology (complementary metal oxide semiconductor technology).

According to various embodiments, process 110 may include forming at least one of the following: a chip, a memory chip, a die, a microprocessor, a microcontroller, a memory structure, a charge storage memory, a random access memory, a dynamic random access memory, a logic circuit, a sensor, a nanosensor, an integrated transceiver, a micro-mechanical system, a micro-electronic device, a nano-electronic device, an electrical circuit, a digital circuit, an analog circuit, and any other electronic device based on semiconductor technology. Further, according to various embodiments, a memory structure (e.g. a memory structure included in the electronic circuit 204) may include at least one of the following: a volatile memory, a DRAM (dynamic random access memory) or a non-volatile memory, a PROM (programmable read only memory), an EPROM (erasable PROM), an EEPROM (electrically erasable PROM), a flash memory, a floating gate memory, a charge trapping memory, an MRAM (magnetoresistive random access memory), a CBRAM (conductive bridge random access memory), and a PCRAM (phase change random access memory).

According to various embodiments, forming an electronic circuit, e.g. in process 110 (as shown in FIG. 1), may include forming at least one electronic component of the following group of electronic components: a resistor, a capacitor, an inductor, a transistor (for example, a field effect transistor (FET) (e.g. a metal oxide semiconductor field effect transistor (MOSFET), a fin field effect transistor (FinFET), or a floating gate transistor)), a test structure, and any other electronic component based on semiconductor technology. According to various embodiments, at least one electronic component of said group of electronic components may be included in the electronic structure 204.

According to various embodiments, process 120 (forming at least one metallization layer structure 206 configured to electrically connect the electronic circuit 204), may include at least one of a layering process, a patterning process, a heat treatment, a cleaning or polishing process, and the like, as described before, creating a metallization layer structure 206 at least one of over and in the electronic circuit 204, wherein the electronic circuit 204 has been formed in process 110 before process 120 is applied.

According to various embodiments, the metallization layer structure 206 may be configured to electrically connect the electronic circuit 204. According to various embodiments, the metallization layer structure 206 may be configured to electrically connect at least a part of electronic components included in the electronic circuit with each other, that means the metallization layer structure 206 may enable the functionality of the electronic circuit 204 and, therefore, the metallization layer structure 206 may be designed as desired for realizing the functionality of the electronic circuit 204. Further, according to various embodiments, the metallization layer structure 206 may include at least a part which may be configured to electrically connect the solid state electrolyte battery 208, formed in process 130, e.g. after processes 110 and 120 have been carried out. Accordingly, the metallization layer structure 206 may enable the functionality of the electronic circuit 204 and may serve to electrically connect at least a part of the solid state electrolyte battery 208.

According to various embodiments, process 120 of forming a metallization layer structure 206 may include forming a contact metallization, e.g. to electrically connect the electronic circuit 204. Forming the metallization layer structure 206 may generate required electrical connections (or interconnections) for electronic components included in the electronic circuit 204 provided on carrier 202 (or on a substrate 202, a wafer 202). According to various embodiments, forming the metallization layer structure 206 may include depositing a layer of a dielectric material (e.g. at least one low-k dielectric material), forming at least one contact hole at a desired location (e.g. using at least one patterning process), and filling the at least one contact hole with at least one electrically conductive material (e.g. using at least one layering process), as described before. Further, according to various embodiments, forming the metallization layer structure 206 may include forming at least one barrier layer, e.g. to prevent diffusion of atoms, ions, or material from the solid state electrolyte battery 208 to the electronic circuit 204. According to various embodiments, the at least one barrier layer may be a part of the metallization layer structure 206 or may be formed additionally to the metallization layer structure 206.

Further, according to various embodiments, forming the metallization layer structure 206 may include at least one metallization process forming a single level metallization or a multilevel metallization, e.g. after the contact metallization has been formed, according to an embodiment. According to various embodiments, the metallization process (forming the metallization layer structure 206) may include at least one layering process and may include at least one patterning process, as described before. According to various embodiments, applying the metallization process (forming the metallization layer structure 206) may further include a planarization of a surface (e.g. the surface of the electronic circuit 204) and/or a planarization of intermediate layers included in the multilevel metallization process.

According to various embodiments, the metallization layer structure 206 formed in process 120 may include at least one electrically conductive material, for example a metal such as for example aluminum, copper, cobalt, tungsten, wherein the process temperatures for layering processes including at least one of aluminum, copper and cobalt, may be lower than 400° C. for example, and the process temperatures for layering processes including tungsten may be larger than 400° C. for example. According to various embodiments, the metallization layer structure 206 formed in process 120 may include at least one dielectric layer, or an insulating layer stack, e.g. using at least one low-k dielectric, e.g. using at least one dielectric material from the following group of dielectric materials: silicon dioxide, (fluorine or carbon) doped silicon dioxide, porous silicon dioxide, porous (fluorine or carbon) doped silicon dioxide, silicon nitride, polymers, organic polymeric dielectrics, polyimide, polynorbornenes, benzocyclobutene, polytetrafluoroethylene, and silicone based polymeric dielectrics (e.g. hydrogen silsesquioxane or methylsilsesquioxane).

According to various embodiments, process 130 (referring to FIG. 1) of forming a solid state electrolyte battery 208 may include at least one of the following processes: a layering process, a patterning process, a doping process, a heat treatment, a cleaning or polishing process, and the like, as described before, wherein the solid state electrolyte battery 208 may be electrically connected to the electronic circuit 204.

According to various embodiments, process 130 may include forming at least one of the following types of batteries: a solid state electrolyte battery (that means a solid state battery, wherein the electrodes are provided via solid state materials and the electrolyte is a solid state material as well), a lithium-ion based battery, a solid state lithium-ion based battery using a solid state electrolyte, a thin-film battery, a lithium-ion based thin-film battery, or any other type of suitable solid state electrolyte battery. According to various embodiments, the battery formed in process 130 may be a primary or a secondary battery; in other words, the solid state electrolyte battery 208 may be a rechargeable battery or a non-rechargeable battery.

According to various embodiments, process 130 may provide the necessary structures for the solid state electrolyte battery. According to various embodiments, an anode, an electrolyte, and a cathode may be formed during process 130. According to various embodiments, the anode, the electrolyte, and the cathode may be formed using standard deposition processes in semiconductor industry, e.g. sputtering, e.g. LPCVD, e.g. ALCVD, or other layering processes as described above.

According to various embodiments, the electrolyte may include or may consist of at least one material of the following group of materials, the group including: lithium, phosphorus, lanthanum, titanium, lithium phosphorus oxynitride, lithium lanthanum titanium oxide (LLTO), a polymer, poly-oxyethylene, $LiPO_{1-x}N_{1-y}$, thio-LISICON materials (lithium superionic conductor), $Li_xMi_{1-y}M'_yS_4$ (M=Si or Ge, and M'=P, Al, Zn, Ga, or Sb), or any other suitable electrolyte (e.g. sodium super ion conductors (NASICON), or NASICON-type materials, e.g. $Na_{1+x+4y}M_{2-y}Si_xP_{3-x}O_{12}$, $0 \leq x \leq 3$, $0 \leq y \leq 1$ (M=Ti, Hf, or Zr)).

According to various embodiments, the cathode may include or may consist of at least one material of the following group of materials, the group including: lithium, cobalt, nickel, aluminium, oxygen, iron, phosphorous, manganese, vanadium, manganese spinel, lithium nickel manganese cobalt, lithium iron phosphate (doped or undoped), olivine, $LiCoO_2$, $LiNiO_2$, $LiNi_{1-x}Co_xO_2$, $LiNi_{0.85}Co_{0.1}Al_{0.05}O_2$, $LiNi_{0.33}Co_{0.33}Mn_{0.33}O_2$, $LiMn_2O_4$ (spinel structure), $LiFePO_4$, $V_2O_5$, $LiMn_2O_4$, and $LiFePO_4$, or any other suitable cathode material (e.g. including nickel or stainless steel).

According to various embodiments, the anode may include or may consist of at least one material of the following group of materials, the group including: silicon, polysilicon, amorphous silicon, carbon, or any other suitable anode material (e.g. titanium).

Further, according to various embodiments, in process 130 at least one cathode current collector and at least one anode current collector may be formed, e.g. including or consisting of at least one material of the following group of materials, the group including: an electrically conductive material, a metal, a metal nitride, a transition metal, a transition metal nitride, platinum, copper, aluminium, gold, titanium nitride, vanadium nitride, molybdenum nitride, tantalum nitride.

According to various embodiments, the at least one current collector may serve as diffusion barrier (e.g. a titanium nitride diffusion barrier). According to various embodiments, a current collector layer may be deposited over the at least one metallization layer structure 206, wherein the current collector layer may also prevent diffusion of atoms, ions, or material from the solid state electrolyte battery 208 to the electronic circuit 204 or to the at least one metallization layer structure 206.

According to various embodiments, at least one anode and at least one cathode of the solid state electrolyte battery 208 may be electrically connected, e.g. via the respective current collector, to the electronic circuit 204, e.g. via the at least one metallization layer structure 206.

According to various embodiments, using method 100, as described above, an integrated rechargeable battery may be manufactured using semiconductor technology. This solution (method) can be integrated in any semiconductor technology. Since the process sequence for creating the battery may be performed at the end of the manufacturing process, there may be little concerns on thermal stability of the used materials (or layers). On-board batteries in the integrated circuits may reduce the system cost. In general, method 100 may combine techniques and materials as used in both, rechargeable batteries and semiconductor structures.

In the following, variations and extensions of method 100 are described, according to various embodiments, which may refer to method 100 as described above. Therefore, features, materials and processes described referring to method 100 may also apply to the processes described in the following, and features, materials and processes described in the following may also apply to method 100.

Figure 3:
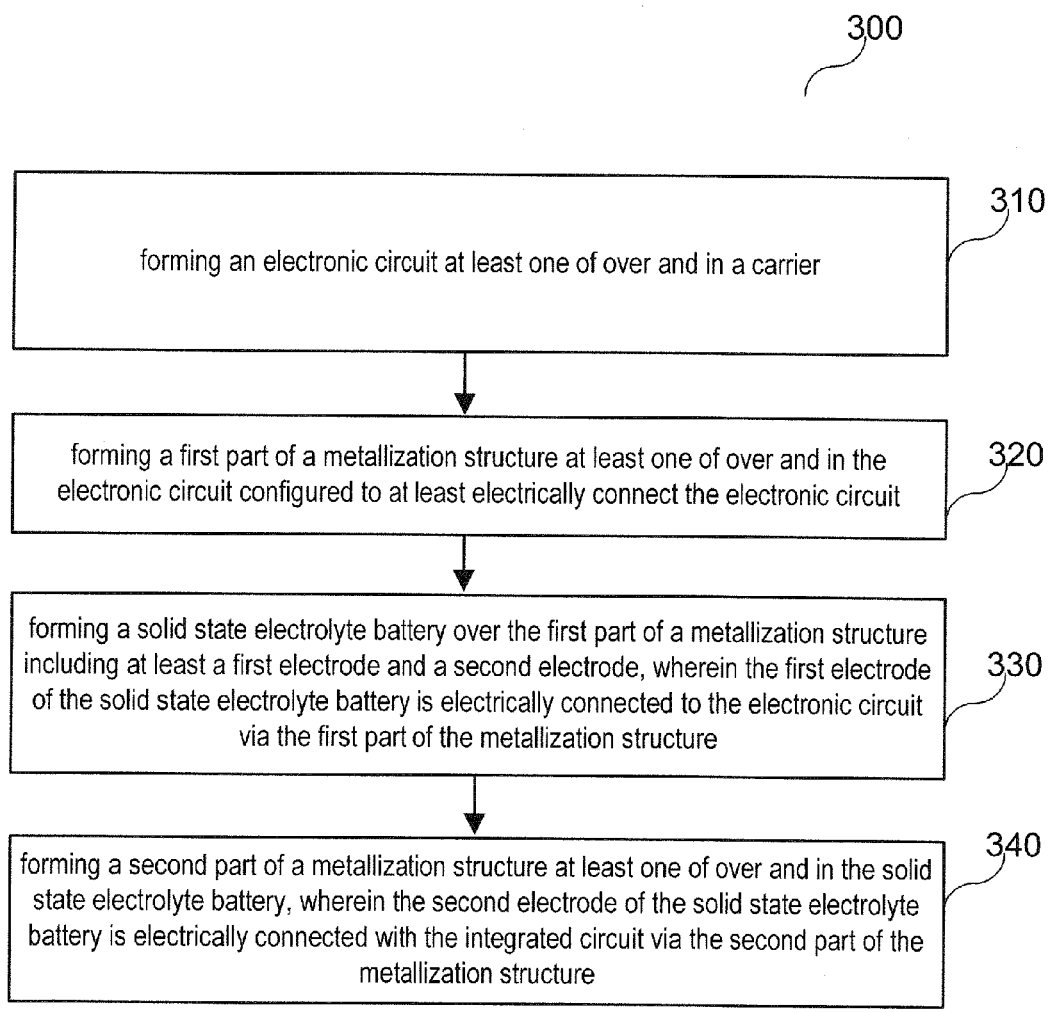
FIG. 3 shows a method for manufacturing an integrated circuit in a flow diagram, according to various embodiments.

FIG. 3 shows a flow diagram of a method 300 for manufacturing an integrated circuit, according to various embodiments. According to various embodiments, the method 300 may include, in 310, forming an electronic circuit at least one of over and in a carrier (in or above a carrier); in 120, forming a first part of a metallization structure at least one of over and in the electronic circuit, wherein the metallization structure is configured to at least electrically connect the electronic circuit; in 130, forming a solid state electrolyte battery over the first part of the metallization structure, the solid state electrolyte battery including at least a first electrode and a second electrode, wherein the first electrode of the solid state electrolyte battery is electrically connected to the electronic circuit via the first part of the metallization structure, and, in 340, forming a second part of the metallization structure at least one of over and in the solid state electrolyte battery, wherein the second electrode of the solid state electrolyte battery is electrically connected with the electronic circuit via the second part of the metallization structure. According to various embodiments, the second part of the metallization structure may cover the solid state electrolyte battery at least partially. According to various embodiments, the second part of the metallization structure may cover the solid state electrolyte battery completely. Further, according to various embodiments, the second part of the metallization structure may also cover a part of the first part of the metallization structure.

Figure 4A:
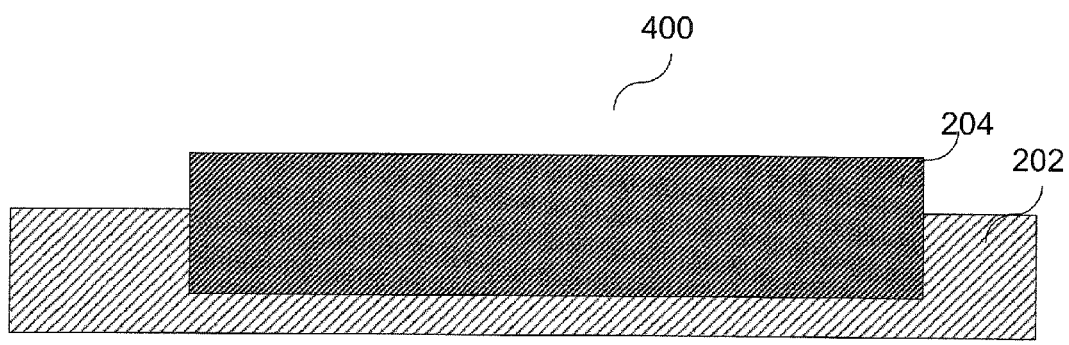
FIGS. 4A to 4C respectively show, according to various embodiments, cross sections of an integrated circuit during manufacture, according to the method shown in FIG. 3.

Referring to FIG. 3, a cross section of an integrated circuit 400 is illustrated in FIG. 4A, after process 310 is carried out, according to various embodiments. Accordingly, the integrated circuit 400 may include at least the following: a carrier 202; and an electronic circuit 204 formed at least one of over and in the carrier 202. Process 310 of method 300 may be performed in analogy to process 110 of method 100, described before referring to FIG. 1, and therefore, process 310 may include similar or the same features, structures, characteristics and functionalities as described referring to process 110.

Figure 4B:
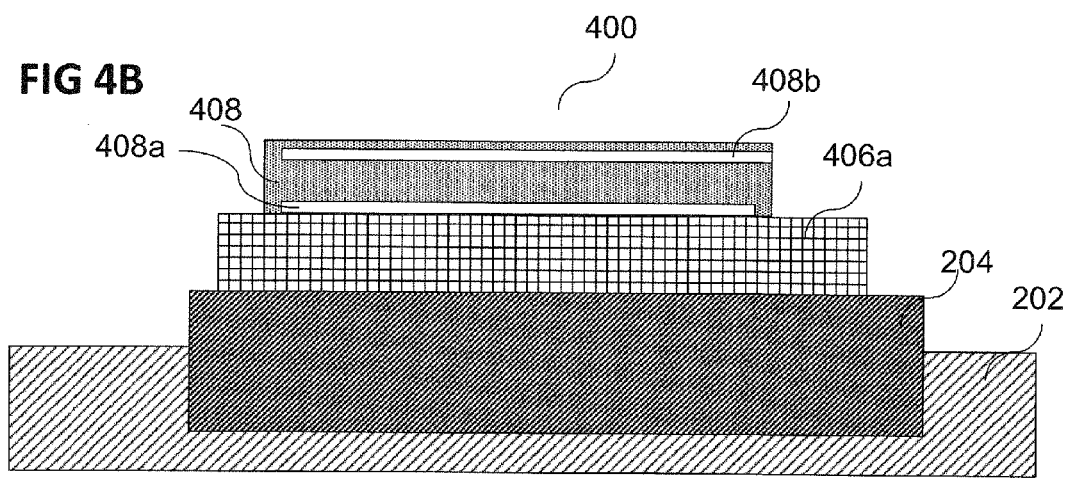

Referring to FIG. 3, a cross section of an integrated circuit 400 is illustrated in FIG. 4B, after processes 310, 320, and 330 are carried out, according to various embodiments. Accordingly, the integrated circuit 400 may include at least the following: the carrier 202; the electronic circuit 204 formed at least one of over and in the carrier 202, a first part 406a of a metallization structure 406 formed at least one of over and in the electronic circuit 204 to at least electrically connect the electronic circuit 204, and a solid state electrolyte battery 408 formed over the first part 406a of the metallization structure 406 including at least a first electrode 408a and a second electrode 408b, wherein the first electrode 408a of the solid state electrolyte battery 408 is electrically connected to the electronic circuit 204 via the first part 406a of the metallization structure 406. Processes 310, 320, and 330 of method 300 may be performed in analogy to processes 110, 120, and 130 of method 100, described before referring to FIG. 1, and therefore, processes 310, 320, and 330 of method 300 may include similar or the same features, structures, characteristics and functionalities as described referring to processes 110, 120, and 130 of method 100.

Accordingly, the solid state electrolyte battery 408 may have similar or the same features, structures, characteristics and functionalities as the solid state electrolyte battery 208, as described before referring to FIG. 1 and FIG. 2. According to various embodiments, the electrolyte (or the electrolyte layer or the electrolyte portion) of the solid state electrolyte battery 408 may be arranged between the first electrode 408a and the second electrode 408b. According to various embodiments, electrode current collectors may be arranged adjoining the electrodes. According to various embodiments, a first electrode current collector of the first electrode 408a may be arranged below the first electrode 408a (adjoining the first electrode 408a). According to various embodiments, a second electrode current collector of the second electrode 408b may be arranged on top of the second electrode 408b (adjoining the second electrode 408b) (not shown in figures).

According to various embodiments, the first electrode 408a may be electrically connected with the electronic circuit 204 via the first part 406a of the metallization structure 406. According to various embodiments, the first electrode 408a may be electrically connected with the electronic circuit 204 via the first electrode current collector and via the first part 406a of the metallization structure 406.

According to various embodiments, the first part 406a of the metallization structure 406 (e.g. a fine pitch metallization 406a) may be completed before process 330 is carried out forming the solid state electrolyte battery 408. According to various embodiments, the first part 406a of the metallization structure 406 may include at least a part which may be configured to electrically connect the solid state electrolyte battery 408, formed in process 330, e.g. after processes 310 and 320 have been carried out. Accordingly, the first part 406a of the metallization structure 406 may enable the functionality of the electronic circuit 204 and may serve to electrically connect the first electrode 408a of the solid state electrolyte battery 408 to the electronic circuit 204.

According to various embodiments, process 320 of forming the first part 406a of the metallization structure 406 may include forming a contact metallization, e.g. to electrically connect the electronic circuit 204. According to various embodiments, forming the first part 406a of the metallization structure 406 may further include a metallization process forming a single level metallization or a multilevel metallization, e.g. after the contact metallization has been formed, according to an embodiment. According to various embodiments, forming the metallization and the contact metallization, or forming the first part 406a of the metallization structure 406, may include at least one layering process and may include at least one patterning process, as described before.

Figure 4C:
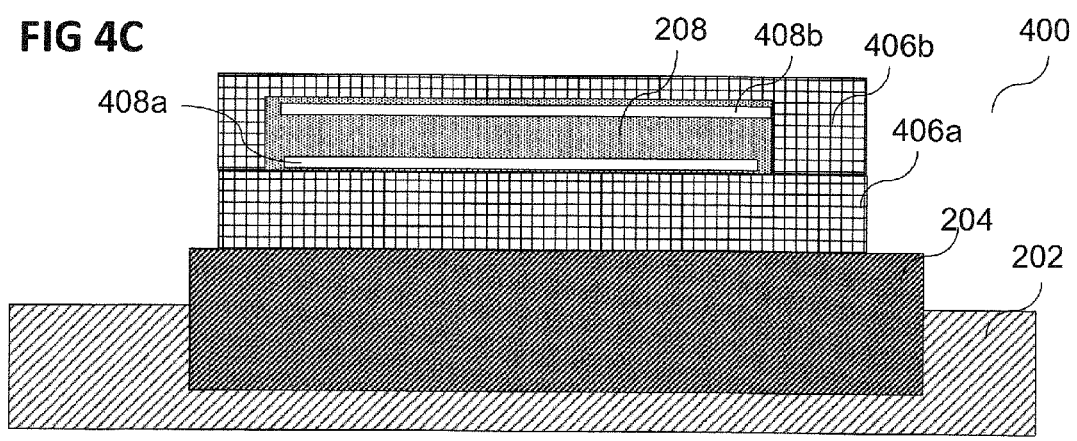

Referring to FIG. 3, a cross section of an integrated circuit 400 is illustrated in FIG. 4C, after processes 310, 320, 330 and 340 have been carried out, according to various embodiments. Accordingly, the integrated circuit 400 may include at least the following: the carrier 202; the electronic circuit 204 formed at least one of over and in the carrier 202, the first part 406a of the metallization structure 406 formed at least one of over and in the electronic circuit 204 to at least electrically connect the electronic circuit 204, the solid state electrolyte battery 408 formed over the first part 406a of the metallization structure 406 and including at least the first electrode 408a and the second electrode 408b, wherein the first electrode 408a of the solid state electrolyte battery 408 is electrically connected to the electronic circuit 204 via the first part 406a of the metallization structure 406; and a second part 406b of the metallization structure 406 formed at least one of over and in the solid state electrolyte battery 408, wherein the second electrode 408b of the solid state electrolyte battery 408 is electrically connected to the electronic circuit 204 via the second part 406b of the metallization structure 406. According to various embodiments, forming the second part 406b of the metallization structure 406 may include metallization processes as described before, e.g. described referring to the at least one metallization layer structure 206 in FIG. 2 or the first part 406a of the metallization structure 406 in FIG. 4B.

According to various embodiments, the second electrode 408b may be electrically connected to the electronic circuit 204 via the second part 406b of the metallization structure 406. According to various embodiments, the second electrode 408b may be electrically connected with the electronic circuit 204 via the second electrode current collector and via the second part 406b of the metallization structure 406. According to various embodiments, the second electrode 408b may be electrically connected with the electronic circuit 204 via the second electrode current collector, via the second part 406b of the metallization structure 406, and via the first part 406a of the metallization structure 406.

According to various embodiments, the second part 406b of the metallization structure 406 may serve to electrically connect the second electrode 408b with the first part 406a of the metallization structure 406 or with the electronic circuit 204 directly. According to various embodiments, at least a part of the second part 406b of the metallization structure 406 may also serve as protection for the solid state electrolyte battery 408.

According to various embodiments, the materials, the material combinations, and other features described referring to method 100 may be applied in method 300 or may be used in an adapted configuration in method 300.

According to various embodiments, FIGS. 5A to 5H respectively show a cross section of a carrier during manufacture of an integrated circuit including several processes and materials as shown and described referring to method 100 and/or method 300.

According to various embodiments, FIG. 5A shows a cross section of an integrated circuit 500 during manufacture. As shown in FIG. 5A, an electronic structure 502 may be provided, wherein the electronic structure 502 may include a carrier 202 and an electronic circuit 204 (e.g. in analogy to carrier 202 and electronic structure 204, as shown in FIG. 2 and/or FIG. 4A), and a first metallization layer structure 510 or first part 510 of a metallization structure (e.g. in analogy to the at least one metallization layer structure 206, as shown in FIG. 2, or e.g. in analogy to the first part 406a of the metallization structure 406, as shown in FIG. 4B) may be provided at least one of over and in the electronic structure 502. According to various embodiments, the electronic structure 502 may include the carrier 202 and the electronic circuit 204, as described before. According to various embodiments, the carrier 202 included in the electronic structure 502 may include silicon, e.g. the carrier 202 may be a silicon wafer or e.g. the carrier 202 may be a silicon substrate, or any other suitable substrate as described before.

According to various embodiments, the first metallization layer structure 510 (e.g. a metallization layer structure of the at least one metallization layer structure) may include at least one dielectric material in regions 508 (e.g. dielectric portions 508) and at least one electrically conductive material in regions 504, 506 (e.g. at least one electrically conductive portion 504 and e.g. at least one electrically conductive portion 506).

According to various embodiments, the electronic structure 502 may be formed by applying process 110 of method 100, or by applying process 310 of method 300, or a modification thereof. According to various embodiments, the first metallization layer structure 510 may be formed by applying process 120 of method 100, or by applying process 320 of method 300, or a modification thereof, to the electronic structure 502.

According to various embodiments, the first metallization layer structure 510 may include at least one electrically conductive material (e.g. in electrically conductive portions 504, 506), for example a metal such as for example aluminum, copper, cobalt, tungsten, wherein the process temperatures for layering processes including at least one of aluminum, copper and cobalt, may be lower than 400° C. for example, and the process temperatures for layering processes including tungsten may be larger than 400° C. for example. According to various embodiments, the first metallization layer structure 510 may further include at least one dielectric material (e.g. in dielectric portions 508), e.g. at least one low-k dielectric, e.g. at least one of the following group of dielectric materials: silicon dioxide, (fluorine or carbon) doped silicon dioxide, porous silicon dioxide, porous (fluorine or carbon) doped silicon dioxide, polymers, organic polymeric dielectrics, polyimide, polynorbornenes, benzocyclobutene, polytetrafluoroethylene, and silicone based polymeric dielectrics (e.g. hydrogen silsesquioxane or methylsilsesquioxane).

According to various embodiments, the first metallization layer structure 510 may be formed by using at least one layering process forming at least one dielectric layer, including a dielectric material as described before, and at least one patterning process for patterning the at least one dielectric layer. According to various embodiments, the at least one patterned dielectric layer may be covered with an electrically conductive material, e.g. using at least one layering process for applying at least one electrically conductive material as described before. According to various embodiments, at least one of holes, recesses and trenches in the at least one dielectric layer created by the patterning of the at least one dielectric layer may be filled with electrically conductive material creating for example vias and conductive lines which may be necessary for realizing the electrical functionality of the electronic circuit (204) included in the electronic structure 502. According to various embodiments, forming the first metallization layer structure 510 may include any suitable metallization process or contact metallization process as described before. According to various embodiments, forming the first metallization layer structure 510 may include forming a multilayer metallization (e.g. having up to 13 metallization planes or even more).

According to various embodiments, the first metallization layer structure 510 may include electrically conductive portions 504, 506 and dielectric portions 508, wherein the electrically conductive portions 504, 506 may serve for electrically connecting a battery (formed in subsequent processes) and the dielectric portions 508 may serve for electrically isolating electrically conductive portions, e.g. to electrically isolate the electrically conductive portions 504 and 506 from each other, e.g. to electrically isolate the electrically conductive portions 504 from each other, e.g. to electrically isolate a battery (formed in subsequent processes) from the electronic circuit 204 included in the electronic structure 502. According to various embodiments, the dielectric portions 508 or the dielectric layer forming the dielectric portions 508 after being patterned may include various dielectric sub-portions or sub-layers for realizing desired electrical properties (e.g. low-k dielectric layer stack).

According to various embodiments, the first metallization layer structure 510 may serve for both, electrically connecting the electronic circuit included in the electronic structure 502, to realize the functionality of the electronic structure 502, and for electrically connecting at least part of a battery (formed in subsequent processes), e.g. electrically connecting a first electrode of a battery (formed in subsequent processes), with the electronic circuit (204) included in the electronic structure 502.

According to various embodiments, the electrically conductive portions 504, 506 may provide an electrically conductive interface to a battery (formed in subsequent processes). According to various embodiments, the electronic structure 502 may be a readily processed integrated circuit in any technology (e.g. CMOS technology), as described before, wherein, according to various embodiments, the fine pitch metallization may be completed. In other words, the electronic structure 502 may include a carrier 202, an electronic circuit 204, and a fine pitch metallization providing the functionality of the electronic circuit 204, wherein the first metallization layer structure 510 may serve to electrically connect a solid-state electrolyte battery to the electronic circuit 204, according to various embodiments.

As shown in FIG. 5B, an insulating layer 512 (e.g. a base layer 512 for the battery formed in subsequent processes) may be formed over the first metallization layer structure 510 (and therefore, also over the electronic structure 502). According to various embodiments, insulating layer 512 may include or may consist of an electrically insulating oxide, e.g. silicon oxide, e.g. silicon dioxide, or an oxynitride, e.g. silicon oxynitride, or silicon nitride, or amorphous silicon, or any other suitable insulating material (e.g. an insulating organic material, e.g. a polymer). According to various embodiments, insulating layer 512 may be formed by using at least one layering process, as described before.

According to various embodiments, the insulating layer 512 may cover the electronic structure 502 completely. According to another embodiment, the insulating layer 512 may cover the electronic structure 502 partially, wherein specific regions of the electronic structure 502 or of the electronic circuit 204 included in the electronic structure 502 may be covered with insulating layer 512. Therefore, according to various embodiments, exclusively specific regions or specific structure elements of the electronic structure 502 (or of the electronic circuit 204 included in the electronic structure 502) may be electrically connected with a battery.

According to various embodiments, insulating layer 512 may have a thickness 505 in a range from several nanometers up to several micrometers, e.g. in the range from about 20 nm to about 5 µm, or a thickness 505 larger than 5 µm, or a thickness 505 smaller than 20 nm, e.g. a thickness 505 in the range from about 100 nm to about 2 µm, e.g. a thickness 505 in the range from about 100 nm to about 1 µm, or a thickness 505 larger than 1 µm.

As shown in FIG. 5C, according to various embodiments, the insulating layer 512 may be patterned, creating a patterned base layer 512a (herein also referred to as base layer structure). The insulating layer 512 (or the base layer 512) may be patterned using an etch process after a masking material (e.g. a soft mask or a hard mask) has been applied. According to various embodiments, the base layer may be patterned using at least one etch process, e.g. a wet etch process or a dry etch process, as described before, e.g. using plasma etching or reactive ion etching, or any other suitable etch process (e.g. deep reactive ion etching).

Figure 6:
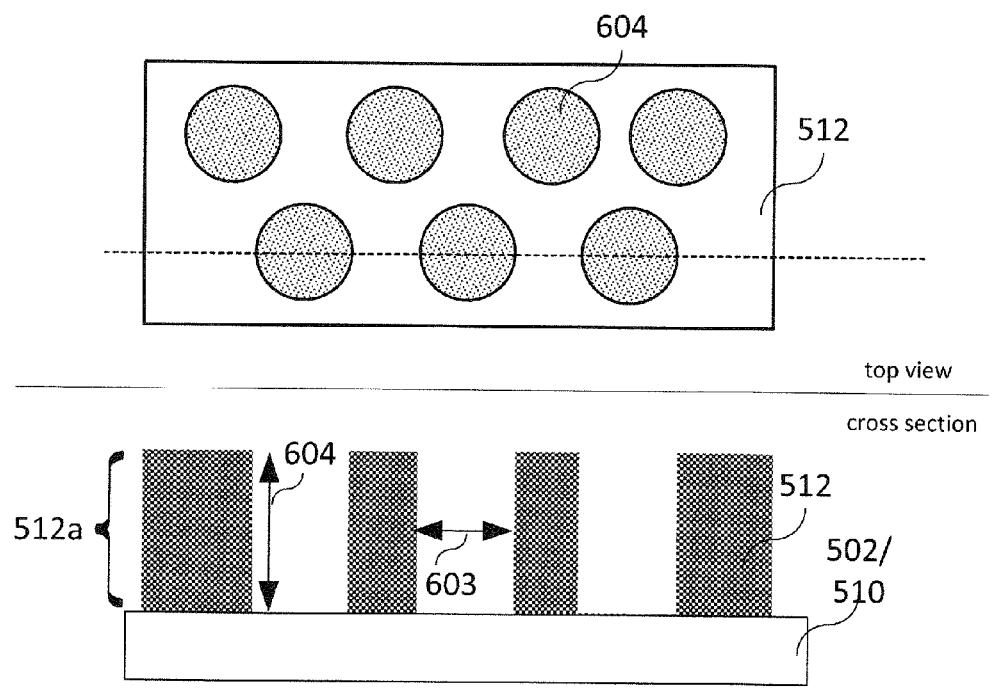
FIG. 6 and FIG. 7 respectively show a top view and a cross section of an integrated circuit during manufacture including a base structure, according to various embodiments.
Figure 7:
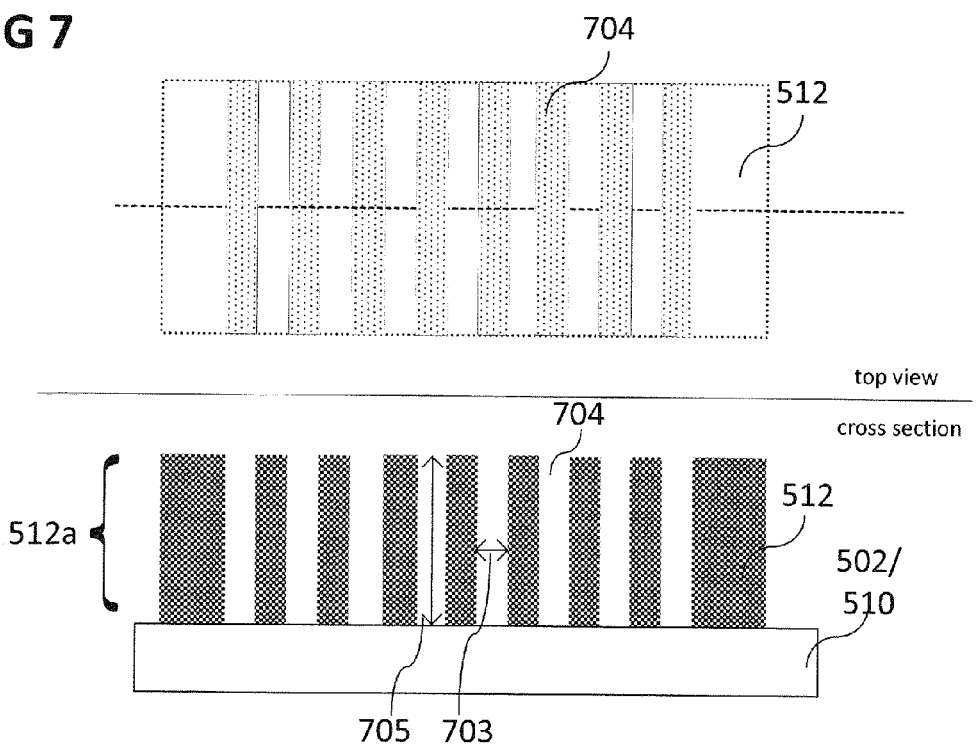

According to various embodiments, patterning the base layer 512 may result in a plurality of base layer structure elements (or in a base layer structure), e.g. a plurality of at least one of fins, holes, trenches and pillars (cf. FIG. 6 and FIG. 7). According to various embodiments, the width of the structure elements (e.g. the width 501a or 501b) of the plurality of base layer structure elements may be in the range from several nanometers up to several micrometers, e.g. in the range from about 10 nm to about 5 µm, or larger than 5 µm, or smaller than 10 nm, e.g. in the range from about 200 nm to about 800 nm, e.g. in the range from about 100 nm to about 500 nm, or larger than 5 nm, or smaller than 100 nm.

According to various embodiments, the distance between adjacent structure elements (e.g. the distance 503) of the plurality of base layer structure elements may be in the range from several nanometers up to several micrometers, e.g. in the range from about 10 nm to about 5 µm, or larger than 5 µm, or smaller than 10 nm, e.g. in the range from about 200 nm to about 800 nm, e.g. in the range from about 100 nm to about 500 nm, or larger than 5 nm, or smaller than 100 nm. Referring to this, the distance between adjacent structure elements of the plurality of base layer structure elements may be regarded as the width of a hole or a trench formed in the base layer 512 (cf. FIG. 6 and FIG. 7). According to various embodiments, the distance between adjacent structure elements of the plurality of base layer structure elements or the width of a hole or a trench formed in the base layer 512 may be adapted to the thickness of a layer stack (e.g. a battery layer stack) formed over the plurality of base layer structure elements in subsequent processes for creating a battery (cf. FIG. 5G). According to various embodiments, the distance between adjacent structure elements of the plurality of base layer structure elements or the width of a hole or a trench formed in the base layer 512 may be equal or larger than two times the thickness of a battery layer stack formed over the plurality of base layer structure elements in subsequent processes for creating a battery (cf. FIG. 5G).

According to various embodiments, the aspect ratio of the structure elements of the plurality of base layer structure elements (e.g. the aspect ratio of the fins, holes, trenches or pillars) may be in the range from about 2 to about 50, e.g. in the range from about 5 to about 20, e.g. larger than 20, e.g. smaller than 5, wherein the aspect ratio of a base layer structure element may be determined by the height of the base layer structure element, which may be equal to the thickness 505 of the base layer 512, and the width (501a, 501b) of the base layer structure element or the distance between adjacent base layer structure elements (503).

According to various embodiments, at least a first set of the base layer structure elements of the plurality of base layer structure elements may be arranged, such that at least one electrically conductive portion 504 or all electrically conductive portions 504 may be exposed in regions between adjacent base layer structure elements. In the case, that the plurality of base layer structure elements including holes or recesses, the holes or recesses may be arranged, such that at least one electrically conductive portion 504 or all electrically conductive portions 504 may be exposed. According to various embodiments, the at least one exposed electrically conductive portion 504 (or all exposed electrically conductive portions 504) may be a part of the first metallization layer structure 510, or a part of the at least one metallization layer structure as described before. According to various embodiments, the at least one exposed electrically conductive portion 504 (or all exposed electrically conductive portions 504) may serve for electrically connecting the electronic structure 502 with a battery formed in subsequent processes.

Forming the base layer structure increases the exposed surface of the integrated circuit 500a at a processing stage before a battery is formed over the base layer structure, according to various embodiments, which may increase the storage capacity of the battery which may be formed over the base layer structure in subsequent processes. Therefore, the pattern of the base layer 512 may be adapted to achieve an optimal surface area, wherein the patterned base layer (including the base layer structure elements) 512a may be formed independently from the underlying structure. According to various embodiments, a plurality of base layer structure elements may be formed, wherein electrically conductive portions 504 may be exposed between a first set of adjacent base layer structure elements of the plurality of base layer structure elements, and wherein electrically insulation portions (e.g. 508) may be exposed between a second set of adjacent base layer structure elements of the plurality of base layer structure elements, that means, that the electrically conductive portions (which may be electrical contacts for a battery for electrically connecting the battery with the electronic structure 502 via the first metallization layer 510) may not be arranged in every region between adjacent base layer structure elements (not shown in figures).

Figure 5D:
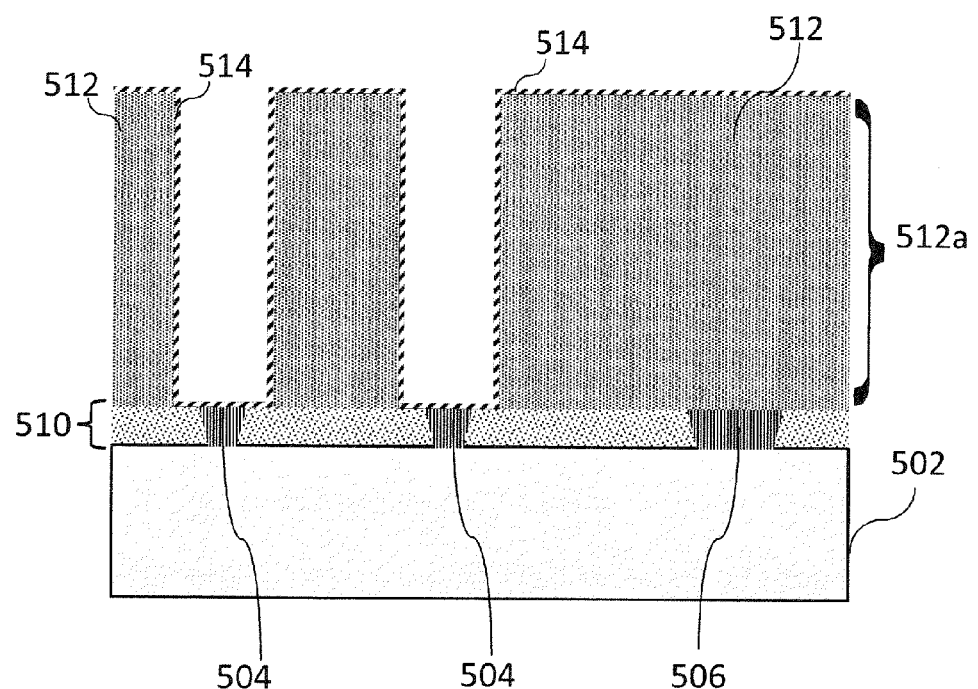

As shown in FIG. 5D, an electrically conductive layer 514 may be formed covering the base layer structure 512a or the plurality of base layer structure elements. According to various embodiments, electrically conductive layer 514 may cover the base layer structure 512a or the plurality of base layer structure elements completely, wherein in this case the electrically conductive layer 514 may serve as barrier layer to prevent diffusion of atoms, ions, or material through this layer. According to various embodiments, electrically conductive layer 514 may also cover at least one electrically conductive portion 504, or all electrically conductive portions 504, forming therefore an electrical connection between the electrically conductive layer 514 and the first metallization layer structure 510, and accordingly, between the layer 514 and the electronic structure 502, according to various embodiments. Further, according to various embodiments, the electrically conductive layer 514 may serve as current collector layer for a battery which is formed in subsequent processes. According to various embodiments, the electrically conductive layer 514 may include at least one of the following materials: an electrically conductive nitride, e.g. a transition metal nitride, such as titanium nitride, molybdenum nitride, tungsten nitride, niobium nitride, tantalum nitride. According to various embodiments, the electrically conductive layer 514 may include various electrically conductive sub-layers, arranged to create optimal diffusion barrier properties to prevent or reduce the diffusion of a specific element through this sub-layer arrangement, e.g. to prevent diffusion from lithium or lithium-ions through the electrically conductive layer 514.

According to various embodiments, the electrically conductive layer 514 (or the electrically conductive diffusion barrier layer 514) may be deposited using atomic layer deposition (e.g. ALD, ALCVD) or LPCVD, or another suitable layering process having a high edge coverage to deposit a conformal electrically conductive diffusion barrier layer 514 over the patterned base layer 512a. According to various embodiments, the electrically conductive diffusion barrier layer 514 (or the arrangement of sub-layers serving as electrically conductive diffusion barrier layer 514) may have a thickness in the range from about 5 nm to about 50 nm, e.g. in the range from about 10 nm to about 30 nm, e.g. smaller than about 10 nm, e.g. larger than about 30 nm, e.g. the electrically conductive diffusion barrier layer 514 may have a thickness of about 20 nm.

Figure 5E:
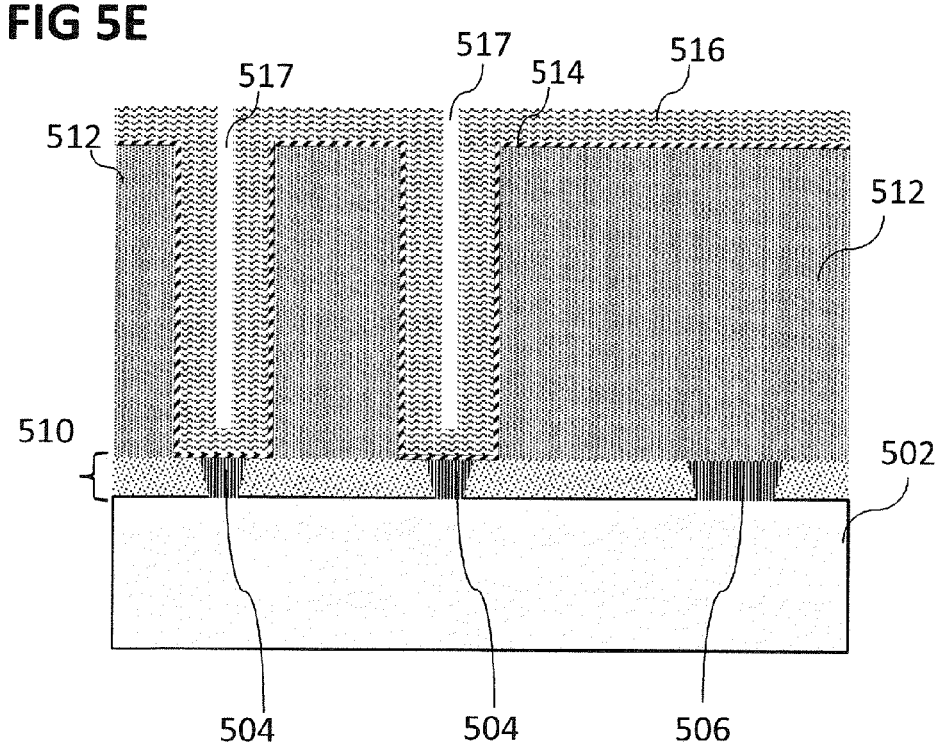

As shown in FIG. 5E, a battery 516 (a solid state electrolyte battery 516, e.g. a thin film battery, e.g. a rechargeable lithium-ion based battery, e.g. a rechargeable lithium-ion based thin film battery, e.g. a rechargeable lithium-ion based solid state electrolyte battery, e.g. a rechargeable lithium-ion based solid state electrolyte thin film battery) may be formed over the electrically conductive layer 514 (or the electrically conductive diffusion barrier layer 514). According to various embodiments, the battery 516 may be electrically connected via the first metallization layer structure 510 with the electronic circuit 502. According to various embodiments, the battery 516 may be electrically connected via the electrically conductive layer 514 and the first metallization layer structure 510 with the electronic circuit 502, wherein the electrically conductive layer 514 may serve as current collector layer for the battery 516, e.g. the electrically conductive layer 514 may be electrically connected to or may adjoin a first electrode, which may be included in the battery 516. According to various embodiments, the electrically conductive layer 514 may include at least two electrically conductive sub-layers, wherein a first sub-layer (e.g. a titanium nitride sub-layer) may serve as diffusion barrier sub-layer and a second sub-layer (e.g. a metal sub-layer) may serve as current collector layer for the battery 516.

According to various embodiments, the battery 516 may have a thickness in the range from about 30 nm to about 200 nm, or a thickness of more than 200 nm, e.g. in the range from about 40 nm to about 100 nm, e.g. a thickness of about 50 nm.

Figure 5F:
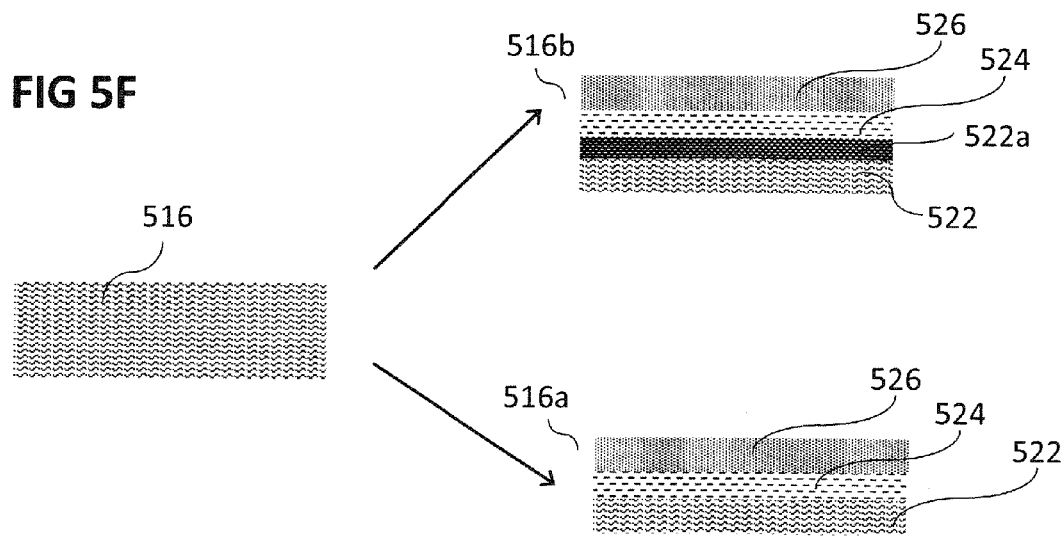

As shown in FIG. 5F, the battery 516 may include or may consist of various layers (e.g. layers 522, 524, 526 or e.g. layers 522, 522a, 524, 526) forming a layer stack 516a, 516b, wherein the layer stack 516a, 516b provides the functionality of the battery 516.

According to various embodiments, the layer stacks 516a, 516b may be formed over the electrically conductive layer 514 to provide necessary structures for the solid state electrolyte battery 516. According to various embodiments, the layer stack may include an electrolyte layer (e.g. layer 524 of the layer stacks 516a, 516b), a cathode layer (e.g. layer 526 of the layer stacks 516a, 516b), and an anode layer (e.g. layer 522 526 of the layer stacks 516a, 516b). According to various embodiments, the layer stack 516b may include an additional functional layer 522a, e.g. a carbon layer 522a, to improve the electrical properties of the anode layer 522. According to various embodiments, the layer stack 516a, 516b may be formed using standard deposition processes in semiconductor industry (e.g. a certain number of layering processes, e.g. 3 or 4 layering processes), e.g. sputtering, e.g. LPCVD, e.g. ALCVD, e.g. ALD, or other layering processes as described above.

According to various embodiments, electrolyte layer 524 of the layer stack 516a, 516b may include or may consist of at least one material of the following group of materials, the group including: lithium, phosphorus, lithium phosphorus oxynitride, a polymer, $LiPF_6$, $LiBF_4$, poly-oxyethylene, $LiPO_{1-x}N_{1-y}$, LISICON materials, and NASICON material, or any other suitable electrolyte material, which could be deposited using standard deposition processes in semiconductor industry.

According to various embodiments, cathode layer 526 of the layer stack 516a, 516b may include or may consist of at least one material of the following group of materials, the group including: lithium, cobalt, nickel, aluminum, oxygen, iron, phosphorus, manganese, vanadium, manganese spinel, lithium nickel manganese cobalt, lithium iron phosphate (doped or undoped), olivine, $LiCoO_2$, $LiNiO_2$, $LiNi_{1-x}Co_xO_2$, $LiNi_{0.85}Co_{0.1}Al_{0.05}O_2$, $LiNi_{0.33}Cu_{0.33}Mn_{0.33}O_2$, $LiMn_2O_4$ (spinel structure), $LiFePO_4$, $V_2O_5$, $LiMn_2O_4$, and $LiFePO_4$, stainless steel, and any other possible material to form a cathode or a cathode layer 526.

According to various embodiments, anode layer 522 may include or may consist of at least one material of the following group of materials, the group including: silicon, carbon, doped silicon, a material compound including silicon or carbon, a metal, titanium and any other possible material to form an anode or an anode layer 522.

According to various embodiments, the anode layer 522, the cathode layer 526, and the electrolyte layer 524 may be configured to be complementary materials forming a battery as desired, wherein using the abovementioned materials or additionally other materials generates a vast number of possible material combinations which may be possible for forming a battery. According to various embodiments, the anode layer 522 may be a silicon layer 522, the cathode layer 526 may be a $LiCoO_2$ layer 526, and the electrolyte layer 524 may be a LiPON layer 524 (or $LiPO_{1-x}N_{1-y}$ layer 524, wherein x and y may range from 0 to 1 respectively). According to various embodiments, the solid state electrolyte may be LiPON (or $LiPO_{1-x}N_{1-y}$ where x and y may range from 0 to 1 respectively). According to various embodiments, the additional functional layer 522a may include for example carbon or pyrolytic carbon which may improve the electrical and physical properties of the anode material, e.g. the silicon layer 522. According to various embodiments, additional functional layer 522a may be formed by using at least one layering process (e.g. by using pyrolytic deposition of carbon). According to various embodiments, the anode layer 522 may include amorphous silicon. According to various embodiments, the anode layer 522, the additional functional layer 522a, the cathode layer 526, and the electrolyte layer 524 may each have a thickness for example in the range from about 5 nm to about 100 nm, e.g. larger than 100 nm, e.g. from about 10 nm to about 50 nm, e.g. smaller than 10 nm, e.g. larger than 50 nm. According to various embodiments, the anode layer 522 may have a thickness of about 30 nm, the additional functional layer 522a may have a thickness of about 15 nm, the cathode layer 526 may have a thickness of about 30 nm, and the electrolyte layer 524 may have a thickness of about 30 nm.

According to various embodiments, the thickness of the anode layer 522 and the corresponding thickness of the cathode layer 526 may be selected according to the charge storage properties of the respective material forming the anode layer 522 and the corresponding cathode layer 526. In the case of a silicon anode layer 522, the thickness of the corresponding cathode layer 526, e.g. including $LiCoO_2$, may be larger than the thickness of the silicon anode layer 522, since the silicon anode layer 522 may store a large amount of lithium-ions per volume (e.g. larger than the cathode material) which may therefore be compensated by a larger thickness of the cathode layer 526.

According to various embodiments, the thickness of the electrolyte layer 524 may be large enough, e.g. larger than 5 nm, to function as an electrolyte layer, e.g. conducting lithium-ions, or e.g. being transparent for lithium-ions (wherein the electrolyte layer may not allow a distinct transport of electrons). According to various embodiments, the electrolyte layer 524 may be deposited using atomic layer deposition, e.g. atomic layer chemical vapor deposition, resulting in a smooth, closed, and dense layer.

According to various embodiments, the surface area of the anode layer may be further increased by using a process for forming a layer, e.g. an anode layer, including spherical grains.

According to various embodiments, after the battery layer stack 516a, 516b or the battery 516 have been formed, an annealing process, e.g. a thermal treatment, may be carried out, e.g. to introduce recrystallization processes or other improvements, such as mechanical stability for example. As it is illustrated in FIG. 5E, after the battery layer stack 516a, 516b or the battery 516 have been formed, there may be still a remaining space 517 between the adjacent base layer structure elements. According to various embodiments, however, it may be the case that the regions between adjacent base layer structure elements may be completely filled, after the battery 516 or the battery layer stacks 516a, 516b have been formed.

Figure 5G:
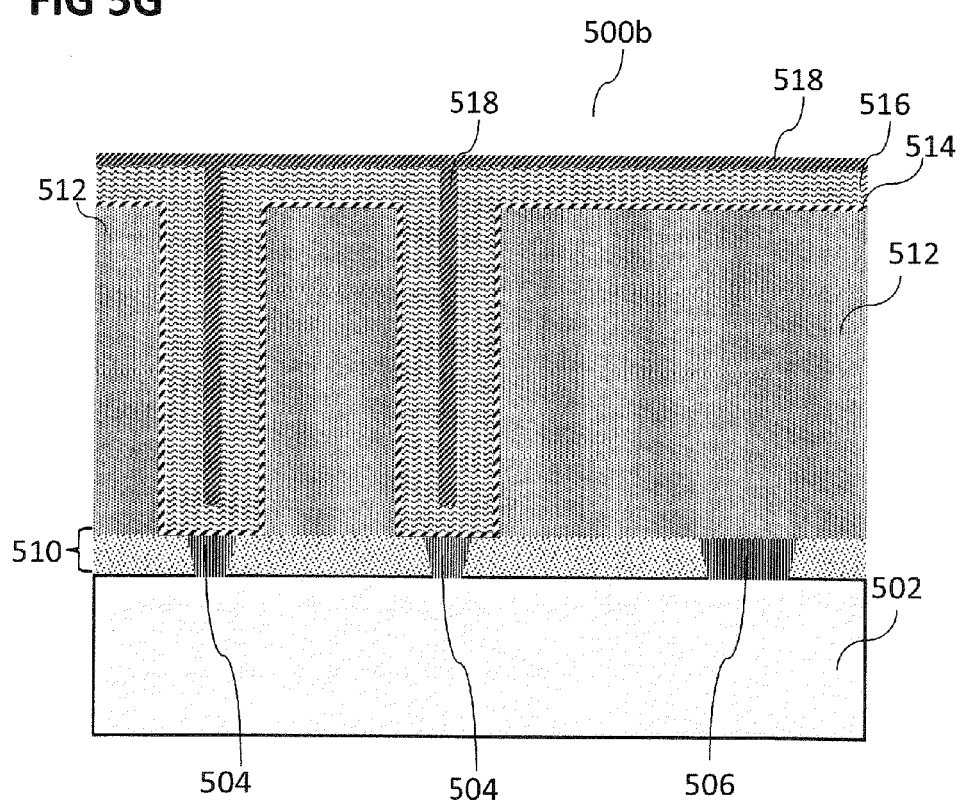

As shown in FIG. 5G, a further electrically conductive layer 518 may be formed over the battery 516 or over the battery layer stack 516a, 516b, e.g. using at least one layering process, as described above. According to various embodiments, the further electrically conductive layer 518 may serve as a cathode current collector layer 518, adjoining the battery 516, or adjoining the battery layer stack 516a, 516b, and therefore, being electrically connected to the battery, e.g. to the cathode layer 526 of the layer stack 516a, 516b. According to various embodiments, cathode current collector layer 518 may include or may consist of at least one material of the following group of materials, the group including: an electrically conductive material, a metal, a metal nitride, a transition metal, a transition metal nitride, platinum, copper, aluminium, gold, titanium nitride, vanadium nitride, molybdenum nitride, tantalum nitride.

According to various embodiments, the further electrically conductive layer 518, e.g. the cathode current collector layer 518, may be formed by using ALCVD, ALD or LPCVD. Using a conformal deposition process, according to various embodiments, the remaining space 517 between adjacent base layer structure elements may be filled with the material of the cathode current collector layer 518. According to various embodiments, the cathode current collector layer 518 may have a thickness in the range of a few nanometers, e.g. 10 nm or even less, up to several micrometers, e.g. 2 μm, 3 μm, or even more. According to various embodiments, the cathode current collector layer 518 may have a thickness below 1 μm or below 100 nm, or below 20 nm, depending on the specific electrical resistance of the material forming the cathode current collector layer 518.

According to various embodiments, the anode layer 522 may store lithium-ions without showing a degradation of the anode material during a plurality of charge and discharge cycles (e.g. more than 100 or more than 1000 or even more). In this regard, the thickness and the geometric arrangement of the anode layer, e.g. the silicon layer 522, may be selected to achieve optimal charge storage capacity and lifetime. According to various embodiments, the base layer structure 512a may determine the geometric arrangement of the battery layer stack 516a, 516b; therefore, the base layer structure may be optimized to achieve optimal charge storage capacity and lifetime. According to various embodiments, the base layer structure may include any type of structure elements, e.g. structure elements having circular shapes (in cross section), structure elements having elliptical shapes (in cross section), structure elements having a V-shape (in cross section), structure elements including steps or projections, and any other type of structure elements.

According to various embodiments, the further electrically conductive layer 518, e.g. the cathode current collector layer 518, may be electrically connected to the first metallization layer structure 510, e.g. to the electrically conductive portion 506 of the first metallization layer structure 510. According to various embodiments, the further electrically conductive layer 518, e.g. the cathode current collector layer 518, may be electrically connected to the electronic structure 502 or to the electronic circuit (204) included in the electronic structure 502. According to various embodiments, the electrical connection of the further electrically conductive layer 518, e.g. the cathode current collector layer 518, may be achieved via a second metallization layer structure or second part 511 of the metallization structure, as shown in FIG. 5K. Therefore, the surface of integrated circuit 500b, shown in FIG. 5G, may be patterned using at least one patterning process.

Figure 5H:
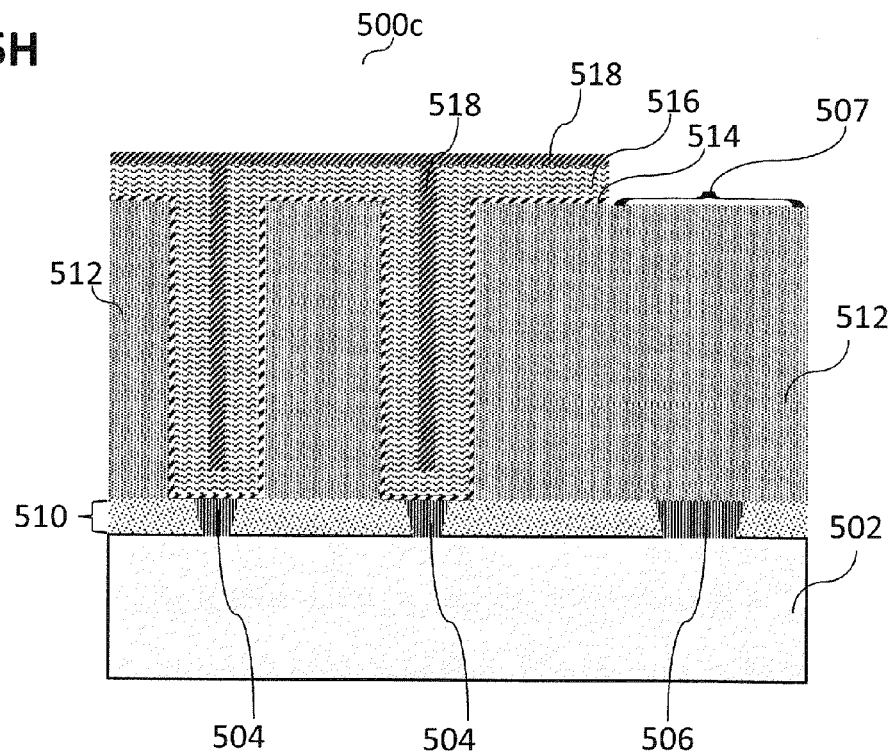
Figure 5I:
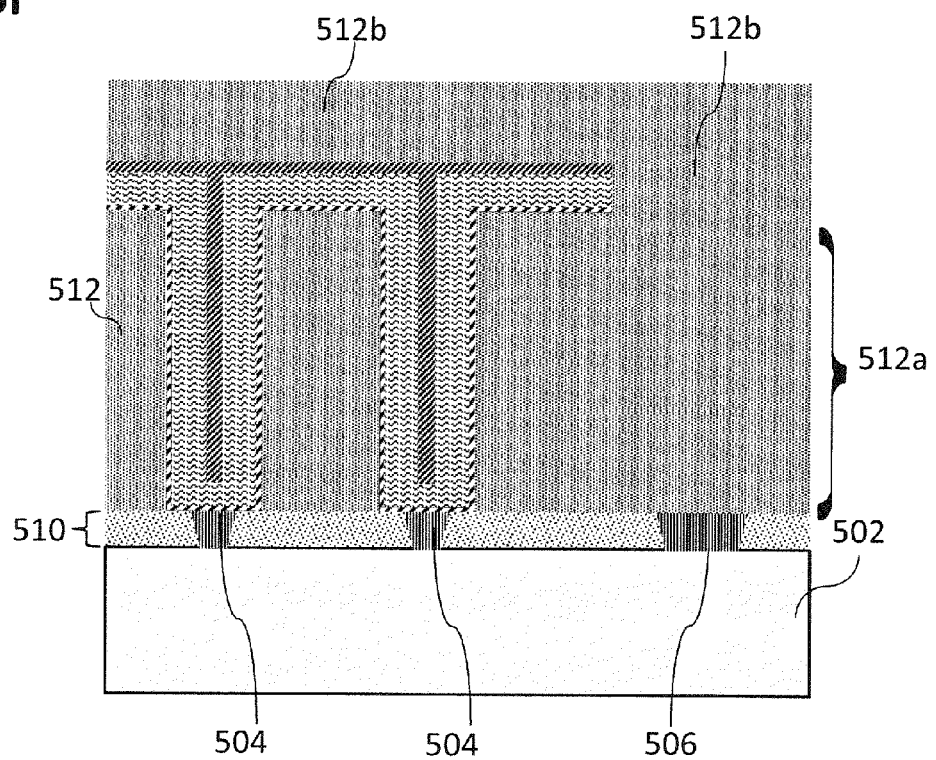

As shown in FIG. 5H, the layers 514 (e.g. the electrically conductive layer 514 or the anode current collector layer 514), 518 (e.g. the electrically conductive layer 518 or the cathode current collector layer 518), and the battery 516 (e.g. the battery layer stack 516a, 516b) may be partially removed, thereby exposing a part of the surface of the insulating layer 512 (e.g. a part of the surface of base layer 512 or a part of the surface of base structure 512). According to various embodiments, partially removing said layers may include at least one lithographic process as well as at least one etch process, as described before. According to various embodiments, the surface area of the insulating layer 512 (of base structure 512) may be exposed in at least one region 507, as shown in FIG. 5H, so that the at least one electrically conductive portion 506 may be arranged below the at least one region 507, to be exposed in a subsequent process.

As shown in FIG. 5, a further insulating layer 512b, e.g. a second insulating layer 512b, may be formed over the surface of the integrated circuit 500c shown in FIG. 5H, covering the at least one exposed region 507 and the exposed surface of the cathode current collector layer 518. According to various embodiments, the further insulating layer 512b may have the same properties or may include the same materials or may consist of the same material as insulating layer 512 (or dielectric portions 508), as described before. According to various embodiments, the further insulating layer 512b may provide a part of the second part 511 of the metallization structure.

Figure 5J:
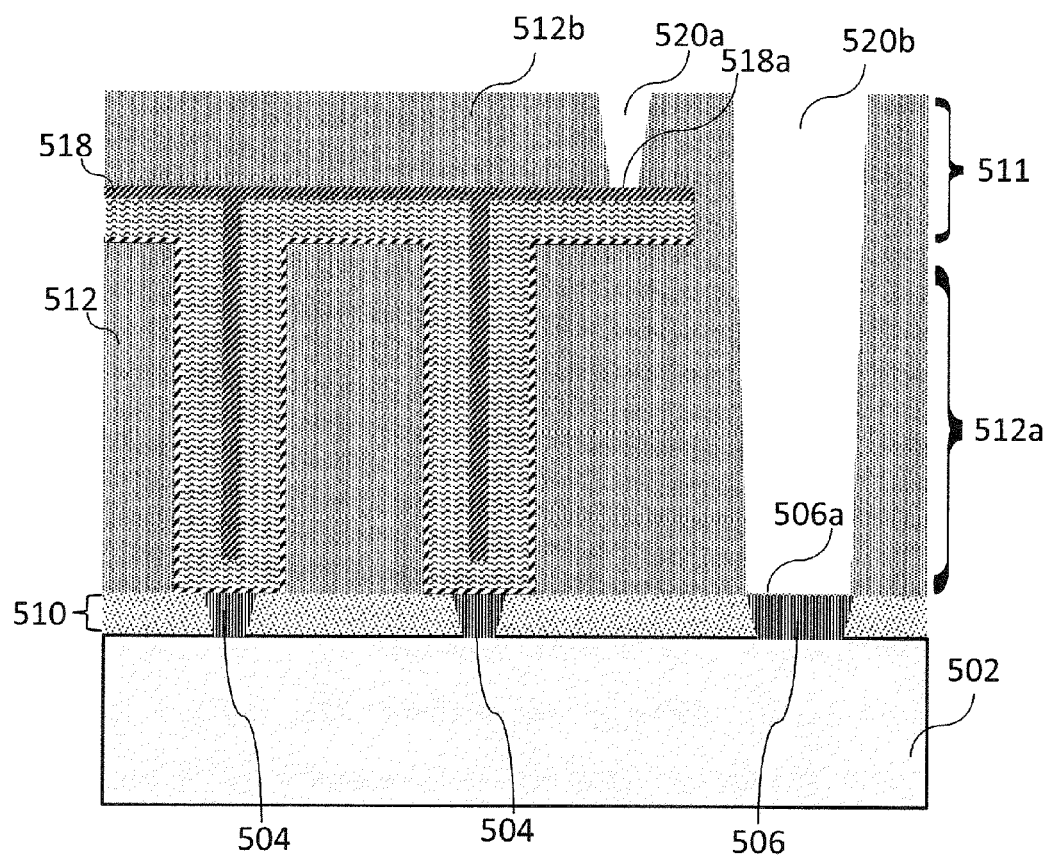

As shown in FIG. 5J, a part of the insulating layer 512 and the further insulating layer 512b (a part of the second part 511 of the metallization structure) may be partially removed, thereby exposing a part of the surface 518a of the cathode current collector layer 518 and at least a part of the surface 506a of the electrically conductive portion 506. According to various embodiments, removing the material of the insulating layer 512 and the further insulating layer 512b may include at least one patterning process, e.g. using at least one lithographic process as well as at least one etch process, as described before. According to various embodiments, the material of the insulating layer 512 and the further insulating layer 512b may be silicon dioxide, wherein in this case, the etch process to remove this material may be selective to silicon dioxide.

As shown in FIG. 5J, patterning the further insulating layer 512b and the insulating layer 512 may form remaining spaces 520a, 520b, which may be filled with an electrically conductive material 530, as shown in FIG. 5K. According to various embodiments, the electrically conductive material 530, and a part of the insulating layer 512 and the further insulating layer 512b may form the second part 511 of the metallization, wherein the cathode current collector layer 518 may be electrically connected to the electrically conductive portion 506, and therefore to the electronic structure 502, via the second part 511 of the metallization, e.g. via the electrically conductive material 530.

FIG. 6 and FIG. 7 respectively show a top view and a cross section of a base layer structure 512a formed over the electronic structure 502 and over the first metallization layer structure 510, according to various embodiments.

As shown in FIG. 6, according to various embodiments, the base layer structure 512a as described herein may be generated by a plurality of holes 604 which may be formed in the insulating base layer 512. According to various embodiments, the diameter 603 of a hole 604 of the plurality of holes 604 may be in the range of about 20 nm to about 400 nm, or may be larger than 400 nm, or may be smaller than 20 nm, or may be e.g. in the range of about 40 nm to about 200 nm, e.g. in the range of about 50 nm to about 100 nm, or may be smaller than 50 nm, according to various embodiments. According to various embodiments, the depth of a hole 604 of the plurality of holes 604 may be in the range from several nanometers up to several micrometers, e.g. in the range from about 20 nm to about 5 μm, or may be larger than 5 μm, or smaller than 20 nm, e.g. in the range from about 100 nm to about 2 μm, e.g. in the range from about 100 nm to about 1 μm, or larger than 1 μm.

As shown in FIG. 7, according to various embodiments, the base layer structure 512a, as described herein, may be generated by a plurality of trenches 704 which may be formed in the insulating base layer 512. According to various embodiments, the distance 703 between adjacent trenches of the plurality of trenches 704 may be in the range of about 20 nm to about 400 nm, or may be larger than 400 nm, or smaller than 20 nm, or may be e.g. in the range of about 40 nm to about 200 nm, e.g. in the range of about 50 nm to about 100 nm, or may be smaller than 50 nm, according to various embodiments. According to various embodiments, the depth of a trench 704 of the plurality of trenches 704 may be in the range from several nanometers up to several micrometers, e.g. in the range from about 20 nm to about 5 μm, or may be larger than 5 μm, or smaller than 20 nm, e.g. in the range from about 100 nm to about 2 μm, e.g. in the range from about 100 nm to about 1 μm, or may be larger than 1 μm.

According to various embodiments, the layer thickness of the anode layer in the battery may be limited due to physical or chemical reasons, e.g. a silicon layer may degrade while storing lithium-ions, if the silicon layer may be too thick, e.g. thicker than 50 nm or thicker than 100 nm for example. According to various embodiments, since the charge storage capacity of the battery (e.g. battery 208, 408, 516) may increase with an increased volume of the charge storing anode layer, e.g. the volume of the material providing the anode which may be silicon, a base structure may be utilized for the integrated battery providing a large surface area covered with the anode material. Depending on the aspect ratio of the base structure elements, the surface area may increase by a factor of 100 or even more. Therefore, the charge storing capacity may increase while the layer thickness of the charge storing anode layer may have a desired thickness.

According to various embodiments, manufacturing the electronic circuit 204 or manufacturing the electronic structure 502 may include at least one front-end-of-line (FEOL) process. According to various embodiments, manufacturing the battery may be performed after the electronic circuit 204 or the electronic structure 502 may be completed, e.g. the FEOL processing may be finished, apart from of the metallization structure.

According to various embodiments, forming the metallization layer structure 206, 510 on top of the base layer structure may provide electrical contacts for electrically connecting the electronic structure 502 or the electronic circuit 204 with the battery 208, 408, 516.

According to various embodiments, a first set of electrical contacts 504 may be exposed after the base layer structure 512 is formed.

According to various embodiments, forming at least one (electrically conductive) barrier layer over the base layer structure may completely cover the base layer structure and the first set of electrical contacts 504.

According to various embodiments, forming a battery layer stack 516 may include depositing at least one first electrode layer (e.g. 522), at least one solid state electrolyte layer (e.g. 524), and at least one second electrode layer (e.g. 526) providing the functionality of a battery.

According to various embodiments, removing the base layer structure and further material over the second set of electrical contacts 506 may expose the second set of electrical contacts 506; and an electrically conductive layer 530 may at least electrically connect the battery layer stack 516a, 516b and the exposed second set of electrical contacts 506.

According to various embodiments, forming an electronic circuit may include forming at least one of an electrical circuit, a chip, a die, a microprocessor, a microcontroller, a memory structure, a memory chip, a charge storage memory, a random access memory, a dynamic random access memory, a logic circuit, a sensor, an integrated transceiver, a micromechanical system, a microelectronic device, a nano-electronic device. According to various embodiments, the electronic circuit may include different types of electronic components, e.g. all possible combinations of the abovementioned components, e.g. an electrical circuit and a memory structure, e.g. an electrical circuit and a sensor.

According to various embodiments, forming the at least one metallization layer structure may include forming a single layer metallization.

According to various embodiments, forming the at least one metallization layer structure may include forming a multi-layer metallization.

According to various embodiments, the solid state electrolyte battery may be formed after the electronic circuit has been formed.

According to various embodiments, at least one diffusion barrier layer may serve as current collector layer as well.

According to various embodiments, the solid state electrolyte battery may include: at least one electrolyte layer including at least one of lithium, phosphorus, lithium phosphate, lithium phosphorus oxynitride, a polymer, poly-oxyethylene, poly-vinylidene fluoride, a co-polymer poly-vinylidene-fluoride-co-hexafluoropropene; at least one cathode layer including at least one of lithium, cobalt, nickel, aluminium, oxygen, iron, phosphorous, manganese, vanadium, manganese spinel, lithium nickel manganese cobalt, lithium iron phosphate, olivine, $LiCoO_2$, $LiNiO_2$, $LiNi_{1-x}Co_xO_2$, $LiNi_{0.85}Co_{0.1}Al_{0.05}O_2$, $LiNi_{0.33}Cu_{0.33}Mn_{0.33}O_2$, $LiMn_2O_4$ (spinel structure), $LiFePO_4$, $V_2O_5$, $LiMn_2O_4$, and $LiFePO_4$; and at least one anode layer including at least one of silicon and carbon.

According to various embodiments, the metallization layer 206, 406, 510 may include at least one patterned dielectric layer 508, e.g. a low-k dielectric layer, and electrical connections realizing the functionality of the underlying electrical circuit.

According to various embodiments, at least one of the anode current collector layer and the cathode current collector layer may serve as a diffusion barrier layer.

According to various embodiments, the at least one metallization layer structure, a first part of a metallization structure, and a second part of the metallization structure may be formed using a metallization process, as described herein.

According to various embodiments, the anode layer and the cathode layer may also be interchanged, such that the anode layer is arranged over the cathode layer, wherein the electrolyte layer is arranged between the anode layer and the cathode layer.

According to various embodiments, the integrated circuit may be finally covered with a protection layer, to protect the underlying battery or to protect the complete underlying integrated circuit.

According to various embodiments, the base layer, the base layer structure, or the plurality of base layer structure elements, (e.g. patterned insulating layer 512) may serve as carrier for the battery layer stack of the solid state electrolyte battery.

According to various embodiments, a method for manufacturing an integrated circuit may include: forming an electronic circuit in or above a carrier, forming at least one metallization layer structure configured to electrically connect the electronic circuit; and forming a solid state electrolyte battery at least partially in the at least one metallization layer structure, wherein the solid state electrolyte battery is electrically connected to the electronic circuit.

According to various embodiments, the electronic circuit may include a plurality of components, wherein the at least one metallization layer structure is configured to electrically connect at least some of the plurality of components of the electronic circuit.

According to various embodiments, a method for manufacturing an integrated circuit may further include forming an electrically insulating base structure between the at least one metallization layer structure and the electronic circuit to provide a carrier structure for the solid state electrolyte battery.

According to various embodiments, a method for manufacturing an integrated circuit may further include forming an electrically insulating base layer over the at least one metallization layer structure below the solid state electrolyte battery; and patterning the electrically insulating base layer before the solid state electrolyte battery is formed to provide a carrier structure for the solid state electrolyte battery.

According to various embodiments, patterning the electrically insulating base layer may include exposing at least one electrically conductive portion of the at least one metallization layer structure arranged below the electrically insulating base layer.

According to various embodiments, patterning the electrically insulating base layer may include forming a plurality of electrically insulating base layer structure elements, wherein at least one electrically conductive portion of the at least one metallization layer structure is exposed between at least two adjacent electrically insulating base layer structure elements of the plurality of electrically insulating base layer structure elements.

According to various embodiments, forming a solid state electrolyte battery may include forming a layer stack, wherein the layer stack includes at least one anode layer, at least one electrolyte layer, at least one cathode layer, formed one above the other, e.g. as a layer stack.

According to various embodiments, the layer stack may be formed using at least one of a low pressure chemical vapor deposition process and an atomic layer deposition process.

According to various embodiments, a method for manufacturing an integrated circuit may further include forming at least one cathode current collector layer adjoining the at least one cathode layer.

According to various embodiments, a method for manufacturing an integrated circuit may further include forming at least one carbon layer between the at least one anode layer and the at least one electrolyte layer.

According to various embodiments, a method for manufacturing an integrated circuit may further include forming at least one anode current collector layer adjoining the at least one anode layer.

According to various embodiments, the solid state electrolyte battery may be a lithium-ion based thin film battery.

According to various embodiments, the solid state electrolyte battery may include silicon as an anode material for a lithium-ion based thin film battery.

According to various embodiments, the solid state electrolyte battery may be formed over at least a part of the electronic circuit adjoining the at least one metallization layer structure.

According to various embodiments, the solid state electrolyte battery may be formed over the patterned electrically insulating base layer, wherein the solid state electrolyte battery is electrically connected to the at least one metallization layer structure via the at least one exposed electrically conductive portion of the at least one metallization layer structure.

According to various embodiments, a method for manufacturing an integrated circuit may further include forming at least one diffusion barrier layer between the integrated circuit and the solid state electrolyte battery.

According to various embodiments, an integrated circuit may include an electronic circuit, which is arranged at least one of over and in a carrier, at least one metallization layer structure configured to electrically connect the electronic circuit; and a solid state electrolyte battery, which is at least partially formed in the at least one metallization layer structure, wherein the solid state electrolyte battery is electrically connected to the electronic circuit.

According to various embodiments, an integrated circuit may further include an electrically insulating base structure arranged between the at least one metallization layer structure and the solid state electrolyte battery to provide a carrier structure for the solid state electrolyte battery.

According to various embodiments, an integrated circuit may further include a patterned electrically insulating base layer at least partially formed over the at least one metallization layer structure, wherein the patterned electrically insulating base layer includes a plurality of electrically insulating base layer structure elements, wherein at least one electrically conductive portion of the at least one metallization layer structure is exposed between at least two adjacent electrically insulating base layer structure elements of the plurality of electrically insulating base layer structure elements.

According to various embodiments, the solid state electrolyte battery may be electrically connected to the at least one metallization layer structure via the at least one exposed electrically conductive portion of the at least one metallization layer structure.

According to various embodiments, the solid state electrolyte battery may include a layer stack including at least one electrolyte layer, at least one cathode layer, and at least one anode layer, formed one above the other.

According to various embodiments, an integrated circuit may further include an anode current collector layer adjoining the least one anode layer and a cathode current collector layer adjoining the least one cathode layer.

According to various embodiments, an integrated circuit may further include a carbon layer between the anode layer and the electrolyte layer.

According to various embodiments, an integrated circuit may further include at least one diffusion barrier layer arranged between the electronic circuit and the solid state electrolyte battery.

According to various embodiments, an integrated circuit may further include an electrically insulating base layer structure arranged between the electronic circuit and the solid state electrolyte battery, wherein the at least one diffusion barrier layer may cover the base layer structure completely, and wherein the at least one diffusion barrier layer includes an electrically conductive diffusion barrier material.

According to various embodiments, a method for manufacturing an integrated circuit may include forming an electronic circuit at least one of over and in a carrier, forming a first part of a metallization structure at least one of over and in the electronic circuit, wherein the metallization structure is configured to at least electrically connect the electronic circuit; forming a solid state electrolyte battery over the first part of the metallization structure, the solid state electrolyte battery including at least a first electrode and a second electrode, wherein the first electrode of the solid state electrolyte battery is electrically connected to the electronic circuit via the first part of the metallization structure; and forming a second part of the metallization structure at least one of over and in the solid state electrolyte battery, wherein the second electrode of the solid state electrolyte battery is electrically connected with the electronic circuit via the second part of the metallization structure.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An integrated circuit, the integrated circuit comprising:
   an electronic circuit, which is arranged at least one of over and in a carrier;
   at least one metallization layer structure configured to electrically connect the electronic circuit;

a solid state electrolyte battery, which is at least partially formed in the at least one metallization layer structure, wherein the solid state electrolyte battery is electrically connected to the electronic circuit; and a patterned electrically insulating base layer at least partially formed over a part of the at least one metallization layer structure, wherein the patterned electrically insulating base layer comprises a plurality of electrically insulating base layer structure elements, wherein at least one electrically conductive portion of the at least one metallization layer structure is exposed between at least two adjacent electrically insulating base layer structure elements of the plurality of electrically insulating base layer structure elements.

2. The integrated circuit of claim 1,
wherein the solid state electrolyte battery is electrically connected to the at least one metallization layer structure via the at least one exposed electrically conductive portion of the at least one metallization layer structure.

3. The integrated circuit of claim 1,
wherein the solid state electrolyte battery comprises a layer stack including at least one electrolyte layer, at least one cathode layer, and at least one anode layer, formed one above the other.

4. The integrated circuit of claim 3, further comprising:
an anode current collector layer adjoining the least one anode layer and a cathode current collector layer adjoining the least one cathode layer.

5. The integrated circuit of claim 3, further comprising:
a carbon layer between the anode layer and the electrolyte layer.

6. The integrated circuit of claim 1, further comprising:
at least one diffusion barrier layer arranged between the electronic circuit and the solid state electrolyte battery.

7. The integrated circuit of claim 6,
further comprising an electrically insulating base layer structure arranged between the electronic circuit and the solid state electrolyte battery, wherein the at least one diffusion barrier layer covers the base layer structure completely, and wherein the at least one diffusion barrier layer comprises an electrically conductive diffusion barrier material.

8. A method for manufacturing an integrated circuit, the method comprising:
forming an electronic circuit in or above a carrier;
forming at least one metallization layer structure configured to electrically connect the electronic circuit;
forming a solid state electrolyte battery at least partially in the at least one metallization layer structure, wherein the solid state electrolyte battery is electrically connected to the electronic circuit;
forming an electrically insulating base layer over a part of the at least one metallization layer structure and below the solid state electrolyte battery; and
patterning the electrically insulating base layer before the solid state electrolyte battery is formed to provide a carrier structure for the solid state electrolyte battery,
wherein patterning the electrically insulating base layer comprises forming a plurality of electrically insulating base layer structure elements, wherein at least one electrically conductive portion of the at least one metallization layer structure is exposed between at least two adjacent electrically insulating base layer structure elements of the plurality of electrically insulating base layer structure elements.

9. The method of claim 8,
wherein the electronic circuit comprises a plurality of components, wherein the at least one metallization layer structure is configured to electrically connect at least some of the plurality of components of the electronic circuit.

10. The method of claim 8,
wherein forming the solid state electrolyte battery comprises forming a layer stack, wherein the layer stack comprises at least one anode layer, at least one electrolyte layer, and at least one cathode layer, formed one above the other.

11. The method of claim 10,
wherein the layer stack is formed using at least one of a low pressure chemical vapor deposition process and an atomic layer deposition process.

12. The method of claim 10, further comprising:
forming at least one cathode current collector layer adjoining the at least one cathode layer.

13. The method of claim 10, further comprising:
forming at least one carbon layer between the at least one anode layer and the at least one electrolyte layer.

14. The method of claim 10, further comprising:
forming at least one anode current collector layer adjoining the at least one anode layer.

15. The method of claim 8,
wherein the solid state electrolyte battery comprises a lithium-ion based thin film battery.

16. The method of claim 8,
wherein the solid state electrolyte battery is formed over at least a part of the electronic circuit adjoining the at least one metallization layer structure.

17. The method of claim 8,
wherein the solid state electrolyte battery is formed over the patterned electrically insulating base layer, wherein the solid state electrolyte battery is electrically connected to the at least one metallization layer structure via the at least one exposed electrically conductive portion of the at least one metallization layer structure.

18. The method of claim 8, further comprising:
forming at least one diffusion barrier layer between the electronic circuit and the solid state electrolyte battery.

19. A method for manufacturing an integrated circuit, the method comprising:
forming an electronic circuit at least one of over and in a carrier;
forming a first part of a metallization structure at least one of over and in the electronic circuit, wherein the metallization structure is configured to at least electrically connect the electronic circuit;
forming a solid state electrolyte battery over the first part of the metallization structure, the solid state electrolyte battery including at least a first electrode and a second electrode, wherein the first electrode of the solid state electrolyte battery is electrically connected to the electronic circuit via the first part of the metallization structure;
forming an electrically insulating base layer over the first cart of the metallization structure and below the solid state electrolyte battery;
patterning the electrically insulating base layer before the solid state electrolyte battery is formed to provide a carrier structure for the solid state electrolyte battery,
wherein patterning the electrically insulating base layer comprises forming a plurality of electrically insulating base layer structure elements, wherein at least one electrically conductive portion of the first part of the metallization structure is exposed between at least two adjacent electrically insulating base layer structure elements of the plurality of electrically insulating base layer structure elements; and forming a second part of the metallization structure at least one of over and in the solid state electrolyte battery, wherein the second electrode of the solid state electrolyte battery is electrically connected with the electronic circuit via the second part of the metallization structure.

* * * * *

UNITED STATES PATENT AND TRADEMARK OFFICE
CERTIFICATE OF CORRECTION

| | |
|---|---|
| PATENT NO. | : 9,107,335 B2 |
| APPLICATION NO. | : 13/769886 |
| DATED | : August 11, 2015 |
| INVENTOR(S) | : Marko Lemke, Mirko Vogt and Stefan Tegen |

It is certified that error appears in the above-identified patent and that said Letters Patent is hereby corrected as shown below:

In the Claims

Col. 30, ln. 59, claim 19, delete "cart of the metallization structure" and insert --part of the metallization structure-- therefor.

Signed and Sealed this
Seventeenth Day of May, 2016

Michelle K. Lee
*Director of the United States Patent and Trademark Office*